United States Patent
Morishita et al.

(10) Patent No.: US 6,768,175 B1
(45) Date of Patent: Jul. 27, 2004

(54) SEMICONDUCTOR SUBSTRATE AND ITS PRODUCTION METHOD, SEMICONDUCTOR DEVICE COMPRISING THE SAME AND ITS PRODUCTION METHOD

(75) Inventors: Takashi Morishita, Shizuoka (JP); Masahiro Matsui, Shizuoka (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/787,877

(22) PCT Filed: Sep. 24, 1999

(86) PCT No.: PCT/JP99/05231
§ 371 (c)(1),
(2), (4) Date: Mar. 23, 2001

(87) PCT Pub. No.: WO00/19500
PCT Pub. Date: Apr. 6, 2000

(30) Foreign Application Priority Data

Sep. 25, 1998 (JP) ............................................. 10-272126

(51) Int. Cl.$^7$ ........................ H01L 27/01; H01L 27/12; H01L 31/0392
(52) U.S. Cl. ...................... 257/352; 257/347; 257/352; 438/14; 438/149; 438/479
(58) Field of Search ................................ 257/347–354, 257/506–507, 57; 438/14, 17, 400, 404, 413, 479, 480, 19

(56) References Cited

U.S. PATENT DOCUMENTS

| | | | | |
|---|---|---|---|---|
| 4,177,084 A | * | 12/1979 | Lau et al. .................... | 117/8 |
| 4,470,618 A | | 9/1984 | Ono | |
| 5,506,433 A | * | 4/1996 | Ohori et al. ................. | 257/347 |
| 5,629,217 A | * | 5/1997 | Miwa et al. ................. | 438/480 |
| 5,801,081 A | * | 9/1998 | Warashina et al. .......... | 438/410 |
| 5,840,616 A | * | 11/1998 | Sakaguchi et al. .......... | 438/459 |
| 5,854,123 A | * | 12/1998 | Sato et al. .................. | 438/507 |
| 6,004,406 A | * | 12/1999 | Kobayashi et al. ......... | 148/33.3 |
| 6,528,387 B1 | * | 3/2003 | Moriyasu et al. ........... | 438/404 |
| 6,534,380 B1 | * | 3/2003 | Yamauchi et al. .......... | 438/455 |

FOREIGN PATENT DOCUMENTS

| | | |
|---|---|---|
| JP | 5180160 | 7/1976 |
| JP | A5828855 | 2/1983 |
| JP | A5982744 | 5/1984 |

OTHER PUBLICATIONS

Furukawa, SOI Structure Formation Technology, p. 133–134 (1987).

* cited by examiner

*Primary Examiner*—Amir Zarabian
*Assistant Examiner*—Ida M. Soward
(74) *Attorney, Agent, or Firm*—Birch, Stewart, Kolasch & Birch, LLP

(57) ABSTRACT

When a SOI substrate is produced a first silicon layer epitaxially grown on the insulating underlay is ion implanted to make deep part of interface of the silicon layer amorphous, and then annealed to recrystallize. Next, the silicon layer is heat treated to oxidize part of the surface side, and after the silicon oxide is removed by etching, a silicon layer is epitaxially grown on the remaining first silicon layer to form a second silicon layer. Subsequently, the second silicon layer is again ion implanted to make deep part of interface amorphous, then annealing is performed to recrystallize. With this method, a SOI substrate, which is very small in crystal defect density of the silicon layer and good in surface flatness, can be produced. Therefore, on the semiconductor substrate an electronic device or optical device having high device performance and reliability can be realized.

59 Claims, 7 Drawing Sheets

SEMICONDUCTOR SUBSTRATE AND ITS PRODUCTION METHOD, SEMICONDUCTOR DEVICE COMPRISING THE SAME AND ITS PRODUCTION METHOD

This application is the national phase under 35 U.S.C. § 371 of PCT International Application No. PCT/JP99/05231 which has an International filing date of Sep. 24, 1999, which designated the United States of America.

FIELD OF THE INVENTION

The present invention relates to a method for producing a semiconductor substrate such as a silicon-on-insulator (SOI) or a silicon-on-sapphire (SOS), to a semiconductor substrate which is small in dislocation or defect and has a silicon layer having a good surface flatness and a production method thereof. Further, the present invention relates to a semiconductor device formed on the above semiconductor substrate and a production method thereof.

DESCRIPTION OF BACKGROUND ART

Heretofore, as a substrate material having a structure where a single crystal silicon semiconductor layer is formed on an insulator, SOI, SOS or the like is known. In the present specification, including the SOI substrate and SOS substrate, those generically named semiconductor substrates in which a single crystal silicon semiconductor is formed on an insulator layer are referred to as SOI substrates. These substrate materials are widely used in device production, and are superior to ordinary silicon substrate in terms of the following points.

(1) High speed through the reduction of parasitic capacity,
(2) strong to software error,
(3) no latch-up, and
(4) a well process can be omitted.

To realize these advantageous device characteristics, the following prior art SOI substrate production methods are known.

(1) Bonding method: after a silicon single crystal substrate is laminated to another silicon single crystal substrate having a thermally oxidized surface using heat treatment or an adhesive, one-side silicon layer is formed into a thin film using mechanical polishing or chemical etching.

(2) SIMOX (Separation by Ion-implanted Oxide) method: After oxygen ions are implanted on to a silicon substrate, heat treatment is performed to form an embedded $SiO_2$ (silicon oxide) layer in the silicon substrate.

(3) Solid phase epitaxial growth method: After the surface of a silicon substrate is oxidized, a window is opened in part of the oxide film to expose the silicon substrate, and an amorphous silicon is grown thereon. Next, heat treatment is performed, starting from the part contacting the exposed silicon, and the amorphous silicon layer is crystallized by lateral direction epitaxial growth.

(4) Hetero-epitaxial growth method: On acrystalline oxide or fluoride layer stacked on a silicon substrate or an insulating oxide substrate, a single crystal silicon layer is grown by a CVD method.

However, these methods have both advantages and disadvanteages, and still have problems in productivity and quality. For example, in the boding method, it is necessary to form the silicon substrate itself into a thin film, and it is extremely difficult to etch or polish the silicon substrate to 1 $\mu$m or less with good accuracy and uniformity.

Even though, the SIMOX method has been studied for long time, there is a problem when forming the $SiO_2$ buried oxide film in the silicon substrate, that is a large amount of oxygen ion must be implanted, which reduces the productivity and increases cost. In addition, there are a lot of crystal defects in the silicon layer and the presence of a defect called a pipe in the embedded oxide film.

In addition, the bonded SOI substrate and the SIMOX substrate have the disadvantages that a device formed thereon (for example a field effect transistor) is low in snap back breakdown voltage tends to generate a kink in current voltage characteristic, and further, negative conduction due to self heating tends to generate, which are problems in quality. The snap back breakdown voltage means that when the device is an PET (field effect transistor), hot carrier generated at the junction of the body and the drain accumulates in the body, and a drain current flows between the drain and body and the source, resulting in a reduced breakdown voltage. The kink is also caused by an accumulation of hot carrier in the body. The negative conduction is a phenomenon that current decreases with increasing voltage. This is generated due to the fact that silicon oxide, which is used as an insulating underlay is low in thermal conductivity. As the gate voltage and the drain voltage increase, heat due to self-heat evolution of FET accumulates, resulting in reduced mobility of the silicon layer.

On the other hand, SOS technology is known as the predecessor of the SOI technology. In the past, SOS substrate has been used mainly in a device requiring radiation tolerance. The SOS substrate, in addition to the advantage of having small parasitic capacity of the SOI substrate, also has a thick insulation layer, so there is the added advantage of having small noise through the substrate. Further, when the FET operates, hot carrier generating at the Junction of the body and drain, i.e., at the interface between the silicon layer and the sapphire layer, immediately recombines, and is thus difficult to accumulate in the body. Therefore, current flowing between the drain and body does not rapidly increase, and the breakdown voltage is not decreased. That is, high snap back breakdown voltage and difficulty of kink generation are important advantages of the SOS substrate. Further, since sapphire is high in thermal conductivity, negative conduction is difficult to generate in the SOS substrate. However, the SOS substrate is produced by heteroepitaxial growth of silicon on the sapphire substrate. Due to the difference in lattice constant or thermal expansion coefficient between the silicon layer and the sapphire substrate ($\alpha$-$Al_2O_3$), there is the generation of large number of defects and large surface roughness which has been a problem.

As means for solving it, it is known that after the silicon layer is further implanted with silicon ions to make a deep part of the silicon layer amorphous, recrystallization is performed by annealing (U.S. Pat. No. 5,416,043). However, even though using this method, the crystalline defect density is still high as compared with bulk silicon.

Further, it is known to prepare an SOI substrate having a silicon substrate with an intermediate layer such as an oxide layer or a fluoride layer thereon, and a single crystal silicon layer is epitaxially grown on the intermediate layer. For example, the use of $\gamma$-$Al_2O_3$ in the intermediate layer is disclosed in Japanese Patent Application Laid-open No. 1-261300. It is expected that in these SOI substrates, the carrier lifetime is short at the interface of the silicon layer and the intermediate layer, a high snap back breakdown voltage same as SOS is obtained, and kink is difficult to generate. However, a reduction in the crystallinity of the silicon layer or an increase of surface roughness caused by the difference in the lattice constant or thermal expansion coefficient is still a problem.

Still further, there is a problem in that in the silicon layer of these SOS substrate and SOI substrate, crystal defect density becomes higher towards the interface with the insulating underlay, and crystallinity is reduced. Therefore, as in the case, for example, when a high-speed, low power-consumption device is formed on: these substrates, in a thin silicon layer with a thickness of 0.05 to 0.3 μm, a very large number of crystalline defects are included, and crystallinity is also degraded.

Therefore, the SOS substrate using a sapphire substrate, or the SOI substrate utilizing an intermediate layer such as an oxide layer or fluoride layer stacked on the silicon substrate, has inferior crystallinity of the silicon layer or surface flatness when compared with the bonded SOI substrate or SIMOX substrate. For example, when a semiconductor device, such as a MOSFET (metal-oxide-semiconductor field effect transistor) is formed on these substrates, there is flicker noise, and a degradation in the FET operation characteristics or reliability such as a decrease of breakdown voltage of the gate oxide film, a reduction in effective mobility or trans-conductance, an increase of leakage current and the like.

As a technique for improving the surface flatness of the silicon layer, a method is known in which a bonded SOI substrate of which the insulator layer is $SiO_2$ is heat treated in reducing atmosphere (Japanese Patent Application Laid-open No. 5-217821). With this method, flatness is improved, however, since the underlay of the silicon layer is $SiO_2$, improvement of snap back breakdown voltage is not noted. With regard to device reliability, a higher snap back breakdown voltage is preferable. When crystallinity of the silicon layer or surface flatness is improved, the device performance or reliability can be improved in SOS substrates or SOI substrates in which a silicon substrate is prepared with an intermediate layer such as an oxide layer or a fluoride layer thereon, and a single crystal silicon layer is epitaxially grown on the intermediate layer. Device performance or reliability that were not obtained with the prior art SOI substrate can be achieved when the crystallinity of the silicon layer or surface flatness is improved such that in addition to characteristics such as low flicker noise, high effective mobility or trans-conductance, high gate oxide film breakdown voltage, low leakage current and the like, there is also a high snap back breakdown voltage, and kink or negative conduction does not generate in current-voltage characteristics.

Further, not only in electronic devices, but also in SOS substrate or in SOI substrates in which on a silicon substrate, an intermediate layer such as an oxide layer or a fluoride layer, and further thereon, a single crystal silicon layer is epitaxially grown, by improving crystallinity of the silicon layer or surface flatness, production of an optical device becomes possible which has heretofore been difficult to be realized on these semiconductor substrates due to high leakage currents, high carrier recombination speeds, or considerable light scattering.

An object of the present invention is to provide a semiconductor substrate such as a SOI substrate or the like of good crystallinity and surface flatness and uniformly low crystal defect density in depth direction, which solves problems of the prior art SOS substrates or SOI substrates in which on a silicon substrate, an intermediate layer such as an oxide layer or a fluoride layer, and further thereon, a single crystal silicon layer is epitaxially grown, and by forming thereon a semiconductor device such as an electronic device or optical device having superior performance and reliability that could not be obtained with the prior art such as high speed, low flicker noise, low leakage current, high snap back breakdown voltage and the like.

DISCLOSURE OF THE INVENTION

Under such circumstances, the inventors have found that, in a production method of semiconductor substrate such that when a silicon layer is grown on a sapphire substrate to produce a SOS substrate, or when an oxide layer or a fluoride layer is stacked as an intermediate layer on a silicon substrate and a silicon layer is grown thereon to produce a SOI substrate, after the silicon layer is grown, the silicon layer is implanted with silicon ions to make a deep part of the silicon layer amorphous, crystallinity is improved by performing recrystallization by annealing, and further thereon, a silicon layer is again homoepitaxially grown to form a silicon layer having less defects and high crytallinity, and further, the silicon layer is implanted with silicon ion to make a deep part of the silicon layer amorphous, and then, recrystallization is performed, thereby forming a highly crystalline silicon layer having very small defects, thus accomplishing the present invention. Further, it has been found that after performing the first recrystallization, heat treatment is performed in an oxidizing atmosphere to oxidize part of the surface side of the silicon layer, and silicon oxide is etched with hydrofluoric acid or the like to leave a small-defect, high-orientation silicon layer, and it has been found that using the silicon layer as a seed layer, by homoepitaxially growing silicon layer again thereon, a small-defect, high-crystallinity silicon layer can be formed.

Further, the inventors have found that, for example, a MOSFET is formed on the semiconductor substrate having a fewer defects and good crystallinity or surface flatness produced by the above production method, as compared with the prior art. There is a conspicuous improvement in the device performances, such as in the operation speed, reduction of flicker noise, reduction of leakage current and the like.

Specifically, a semiconductor substrate according to item 1 of the present invention comprises an insulating underlay and a crystalline silicon layer epitaxially grown thereon, the insulating underlay is a semiconductor substrate comprising a single crystal oxide substrate or a laminated substrate comprising a silicon substrate and a crystalline oxide layer or fluoride layer stacked thereon, wherein a defect density evaluated by a defect density measuring method of measuring the number of pits per unit area formed by immersing in an iodine type etching solution is $7 \times 10^6/cm^2$ or less over the entire depth direction, and the surface roughness of the crystalline silicon layer is 0.2 nm or less and 0.05 nm or more.

The semiconductor substrate according to item 2 of the present invention is characterized in that in the semiconductor substrate as described in above item 1, of the crystalline silicon layer, X-ray diffraction rocking curve full width at half maximum of a silicon (004) peak parallel to the substrate surface is 0.24 degree or less and 0.03 degree or more, and X-ray diffraction rocking curve full width at half maximum of a silicon (040) peak perpendicular to the substrate surface is 0.18 degree or less and 0.03 degree or more.

The semiconductor substrate according to item 3 of the present invention is characterized in that in the semiconductor substrate as described in above item 1, of the crystalline silicon layer, X-ray diffraction rocking curve full width at half maximum of a silicon (040) peak perpendicular to the substrate surface is smaller than X-ray diffraction rocking curve full width at half maximum of a silicon (004) peak parallel to the substrate surface.

The semiconductor substrate according-to item 4 of the present invention is characterized in that in the semiconductor substrate as described in above item 1, of the crystalline silicon layer, X-ray diffraction rocking curve full width at half maximum of a silicon (040) peak perpendicular to the substrate surface is almost constant over the entire depth direction and 0.18 degree or less and 0.03 degree or more.

The semiconductor substrate according to item 5 of the present invention is characterized in that in the semiconductor substrate as described in above item 1, after part of the crystalline silicon layer is thermally oxidized to form a silicon oxide layer on the crystalline silicon layer, interface level density measured by a charge pumping method is $3 \times 10^{11}/cm^2$ or less and $1 \times 10^9/cm^2$ or more.

The semiconductor substrate according to item 6 of the present invention is characterized in that in the semiconductor substrate as described in above item 1, thickness of the crystalline silicon layer is 0.03 $\mu$m or more and 0.7 $\mu$m or less.

The semiconductor substrate according to item 7 of the present invention is characterized in that in the semiconductor substrate as described in above item 1, the insulating underlay is the single crystal oxide substrate, and the single crystal oxide substrate is a sapphire substrate.

The semiconductor substrate according to item 8 of the present invention is characterized in that in the semiconductor substrate as described in above item 1, the insulating underlay is the laminated substrate, the crystalline oxide layer stacked on the silicon substrate as the substrate comprises one of $\alpha$-$Al_2O_3$, $\gamma$-$Al_2O_3$, $\theta$-$Al_2O_3$, $MgO.Al_2O_3$, $CeO_2$, $SrTiO_3$, $(Zr_{1-x}Y_x)O_y$, $Pb(Zr, Ti)O_3$, $LiTaO_3$, and $LiNbO_3$, and the fluoride layer comprises $CaF_2$.

Further, item 9 of the present invention is a method of producing the semiconductor substrate with a low defect density silicon layer formed on an insulating underlay, the method comprising:
 (a) a step of forming a first silicon layer on the insulating underlay;
 (b) a step of performing a first ion implantation to the first silicon layer to make a deep part of the interface amorphous, and recrystallizing the amorphous layer by a first heat treatment;
 (c) a step of epitaxially growing a silicon layer on the first silicon layer to form a second silicon layer; and
 (d) a step of performing a second ion implantation to the second silicon layer to make a deep part of the interface amorphous, and recrystallizing the amorphous layer by a second heat treatment.

Still further, item 10 of the present invention is a method of producing a semiconductor substrate with a low defect density silicon layer formed on an insulating underlay, the method comprising:
 (a) a step of forming a first silicon layer on the insulating underlay;
 (b) a step of performing a first ion implantation to the first silicon layer to make a deep part of the interface amorphous, and recrystallizing the amorphous layer by a first heat treatment;
 (c) a step of heat treating the recrystallized first silicon layer in an oxidizing atmosphere to oxidize part of surface side;
 (d) a step of removing silicon oxide film formed in the step (c) by etching;
 (e) a step of epitaxially growing a silicon layer on remaining first silicon layer to form a second silicon layer; and
 (f) a step of performing a second ion implantation to the second silicon layer to make a deep part of the interface amorphous, and recrystallizing the amorphous layer by a second heat treatment.

Yet further, the production method of semiconductor substrate according to item 11 of the present invention is characterized in that in the production method as described in item 10, when the remaining first silicon layer is formed to a predetermined thickness, the steps (c) to (d) are repeated two times or more.

The production method of semiconductor substrate according to item 12 of the present invention is characterized in that in the production method as described: in item 10 or 11, the silicon layer formed in the step (f) is regarded as the recrystallized first silicon layer formed in the step (b), and the steps (c) to (f) are repeated two times or more.

Further, the method of semiconductor substrate according to item 13 of the present invention is a method of producing a semiconductor substrate with a low defect density silicon layer formed on an insulating underlay, the method comprising:
 (a) a step of forming a first silicon layer on the insulating underlay;
 (b) a step of heat treating the first silicon layer in an oxidizing atmosphere to oxidize part of surface side;
 (c) a step of removing silicon oxide film formed in the step (b) by etching;
 (d) a step of epitaxially growing a silicon layer on remaining first silicon layer to form a second silicon layer; and
 (e) a step of ion implanting to the second silicon layer to make a deep part of the interface amorphous, and recrystallizing the amorphous layer by heat treatment.

The production method of semiconductor substrate according to item 14 of the present invention is characterized in that in the production method as described in item 13, when the remaining first silicon layer is formed to a predetermined thickness, the steps (b) to (c) are repeated two times or more.

The production method of semiconductor substrate according to item 15 of the present invention is characterized in that in the production method as described in item 13, the silicon layer formed in the step (e) is regarded as the first silicon layer formed in the step (a), and the steps (b) to (e) are repeated two times or more.

The production method of semiconductor substrate according to item 16 of the present invention is characterized in that in the production method as described in any one of items 10 to 15, the oxidizing atmosphere contains a mixed gas of oxygen and hydrogen or water vapor.

The production method of semiconductor substrate according to item 17 of the present invention is characterized in that in the production method as described in any one of items 10 to 16, the temperature of heat treatment in the oxidizing atmosphere is 600° C. or more and 1300° C. or less.

The production method of semiconductor substrate according to item 18 of the present invention is characterized in that in the production method as described in any one of items 10 to 16, the heat treatment in the oxidizing atmosphere comprises two-stage heat treatment of different temperatures of a high temperature heat treatment performed at a high temperature and a low temperature heat treatment performed at a lower temperature subsequent to the high temperature heat treatment.

The production method of semiconductor substrate according to item 19 of the present invention is characterized in that in the production method as described in item 18, the temperature of high temperature heat treatment in the oxidizing atmosphere is 800° C. or more and 1200° C. or less, and temperature of low temperature heat treatment in the oxidizing atmosphere is 700° C. or more and 1100° C. or less.

The production method of semiconductor substrate according to item 20 of the present invention is characterized in that in the production method as described in any one of items 9 to 15, the temperature at which a silicon layer is epitaxially grown on the first silicon layer to form a second silicon layer is 550° C. or more and 1050° C. or less.

The production method of semiconductor substrate according to item 21 of the present invention is characterized in that in the production method as described in any one of items 9 to 15, before the step of epitaxially growing a silicon layer on the first silicon layer to form a second silicon layer, the first silicon layer is heat treated in a hydrogen atmosphere or in a vacuum.

The production method of semiconductor substrate according to item 22 of the present invention is characterized in that in the production method as described in any one of items 9 to 15, a base pressure of growing chamber of apparatus used when a silicon layer is epitaxially grown on the first silicon layer to form a second silicon layer is $10^{-7}$ Torr or less.

The production method of semiconductor substrate according to item 23 of the present invention is characterized in that in the production method as described in any one of items 9 to 15, the method of epitaxially growing a silicon layer on the first silicon layer to form a second silicon layer is a UHV-CVD method or a MBE method.

The production method of semiconductor substrate according to item 24 of the present invention is characterized in that in the production method as described in any one of items 9 to 15, when epitaxially growing a silicon layer on the first silicon layer to form a second silicon layer, the growing temperature is set high only in an initial stage of growth.

The production method of semiconductor substrate according to item 25 of the present invention is characterized in that in the production method as described in item 24, a method of epitaxially growing a silicon layer on the first silicon layer to form a second silicon layer is an APCVD method or a LPCVD method.

The production method of semiconductor substrate according to item 26 of the present invention is characterized in that in the production method as described in any one of items 9 to 15, after the step of ion implanting to the second silicon layer to make a deep part of the interface amorphous, and recrystallizing the amorphous layer by heat treatment, or after the step of epitaxially growing a silicon layer to form a second silicon layer, further comprising a step of heat treatment in hydrogen.

The production method of semiconductor substrate according to item 27 of the present invention is characterized in that in the production method as described in item 26, the temperature of the heat treatment in hydrogen is 800° C. or more and 1200° C. or less.

The production method of semiconductor substrate according to item 28 of the present invention is characterized in that in the production method as described in any one of items 9 to 15, after the step of ion implanting to the second silicon layer to make a deep part of interface amorphous, and recrystallizing the amorphous layer by heat treatment, the surface of silicon layer is flattened.

The production method of semiconductor substrate according to item 29 of the present invention is characterized in that in the production method as described in item 28, the method of flattening surface of the silicon layer is a chemical and/or mechanical polishing.

The production method of semiconductor substrate according to item 30 of the present invention is characterized in that in the production method as described in any one of items 9 to 29, the step of forming a first silicon layer on the insulating underlay is a step of epitaxially growing the first silicon layer on the insulating underlay.

The production method of semiconductor substrate according to item 31 of the present invention is characterized in that in the production method as described in any one of items 9 to 30, the insulating underlay is a single crystal oxide substrate.

The production method of semiconductor substrate according to item 32 of the present invention is characterized in that in the production method as described in item 31, the insulating underlay is a sapphire substrate.

The production method of semiconductor substrate according to item 33 of the present invention is characterized in that in the production method as described in any one of items 9 to 30, the insulating underlay is a laminated substrate comprising crystalline oxide layer or fluoride layer stacked on the silicon substrate as a substrate.

The production method of semiconductor substrate according to item 34 of the present invention is characterized in that in the production method as described in item 33, the crystalline oxide layer comprises one of $\alpha\text{-Al}_2\text{O}_3$, $\gamma\text{-Al}_2\text{O}_3$, $\theta\text{-Al}_2\text{O}_3$, $\text{MgO.Al}_2\text{O}_3$, $\text{CeO}_2$, $\text{SrTiO}_3$, $(\text{Zr}_{1-x}\text{Y}_x)\text{O}_y$, $\text{Pb}(\text{Zr, Ti})\text{O}_3$, $\text{LiTaO}_3$, and $\text{LiNbO}_3$, and the crystalline fluoride layer comprises $\text{CaF}_2$.

Further, the semiconductor substrate according to item 35 of the present invention is characterized in that it is produced by the production method as described in any one of items 9 to 34.

The semiconductor substrate according to item 36 of the present invention is characterized in that in the semiconductor substrate as described in any one of items 1 to 8, it is produced by the production method as described in any one of items 9 to 34.

Further, a semiconductor device according to item 37 of the present invention is characterized in that it is a semiconductor device using a semiconductor substrate as substrate, as the semiconductor substrate, the semiconductor substrate as described in any one of items 1 to 8 is used, whereby improving device characteristics.

The semiconductor device according to item 38 of the present invention is characterized in that in the semiconductor device as described in item 37, the semiconductor device is MOSFET, and the device characteristics are improved by using the semiconductor substrate as described in any one of items 1 to 8 as semiconductor substrate thereof is at least one of trans-conductance, cut-off frequency, flicker noise, electrostatic discharge, drain breakdown voltage, dielectric breakdown charge amount, and leakage current characteristics.

The semiconductor device according to item 39 of the present invention is characterized in that in the semiconductor device as described in item 38, the MOSFET uses the semiconductor substrate as described in any one of items 1 to 8 as the semiconductor substrate thereof, is a MOSFET formed on a semiconductor substrate with a thickness of crystalline silicon layer of 0.03 µm or more and 0.7 µm or less, no kink appears in current—voltage characteristic, drain breakdown voltage for the case of a gate length of 0.8 µm is 7V or more, and has a characteristic that input gate voltage spectral density representing flicker noise is $3\times10^{-12}$ $\text{V}^2/\text{Hz}$ or less at a measuring frequency of 100 Hz.

The semiconductor device according to item 40 of the present invention is characterized in that in the semiconductor device as described in item 37, the semiconductor device is a bipolar transistor, and the device characteristic improved by using the semiconductor substrate as described in any one of items 1 to 8 as semiconductor substrate thereof is at least one of trans-conductance, cut-off frequency, collector current, leakage current, and current gain.

The semiconductor device according to item 41 of the present invention is characterized in that in the semiconductor device as described in item 37, the semiconductor device is a diode, and the device characteristic improved by using the semiconductor substrate as described in any one of items 1 to 8 as semiconductor substrate thereof is at least one of reverse bias leakage current, forward bias current, and diode factor.

The semiconductor device according to item 42 of the present invention is characterized in that in the semiconductor device as described in item 41, the diode is a pin photodiode formed on the semiconductor substrate as described in any one of items 1 to 8 as the semiconductor substrate thereof having a thickness of crystalline silicon layer of 0.03 $\mu$m or more and 0.7 $\mu$m or less, having a pin area width of each 1 $\mu$m, and having characteristics that dark current measured under a condition applied with a 2V reverse bias is $10^{-11}$ A or less, and photocurrent under light irradiation of 1W/cm$^2$ intensity at wavelength 850 nm is $10^{-10}$ A or more.

The semiconductor device according to item 43 of the present invention is characterized in that in the semiconductor device as described in item 37, the semiconductor device is a semiconductor device integrated circuit, and the device characteristic improved by using the semiconductor substrate as described in any one of items 1 to 8 as semiconductor substrate thereof is at least one of frequency characteristic, noise characteristic, amplification characteristic, and power consumption characteristic.

Further, the semiconductor device according to item 44 of the present invention is a semiconductor device using a semiconductor substrate as the substrate characterized in that as the semiconductor substrate, the semiconductor substrate produced by the production method as described in any one of items 9 to 34 is used, whereby improving device characteristics.

The semiconductor device according to item 45 of the present invention is characterized in that in the semiconductor device as described in item 44, the semiconductor device is a MOSFET, and the device characteristic is at least one of trans-conductance, cut-off frequency, flicker noise, electrostatic discharge, drain breakdown voltage, dielectric breakdown charge amount, and leakage current characteristics.

The semiconductor device according to item 46 of the present invention is characterized in that in the semiconductor device as described in item 45, the MOSFET uses the semiconductor substrate produced by the production method as described in any one of items 9 to 34 as the semiconductor substrate thereof, is a MOSFET formed on a semiconductor substrate with a thickness of crystalline silicon layer of 0.03 $\mu$m or more and 0.7 $\mu$m or less, having characteristics that no kink appears in current—voltage characteristic, drain breakdown voltage for the case of a gate length of 0.8 $\mu$m is 7V or more, and input gate voltage spectral density representing flicker noise is $3\times10^{-12}$ V$^2$/Hz or less at a measuring frequency of 100 Hz.

The semiconductor device according to item 47 of the present invention is characterized in that in the semiconductor device as described in item 44, the semiconductor device is a bipolar transistor, and the device characteristic is at least one of trans-conductance, cut-off frequency, collector current, leakage current, and current gain.

The semiconductor device according to item 48 of the present invention is characterized in that in the semiconductor device as described in item 44, the semiconductor device is a diode, and the device characteristic is at least one of reverse bias leakage current, forward bias current, and diode factor.

The semiconductor device according to item 49 of the present invention is characterized in that in the semiconductor device as described in item 48, the diode is a pin photodiode formed on the semiconductor substrate as described in any one of items 1 to 8 as the semiconductor substrate thereof having a thickness of crystalline silicon layer of 0.03 $\mu$m or more and 0.7 $\mu$m or less, having a pin area width of each 1 $\mu$m, and having characteristics that dark current measured under a condition applied with a 2V reverse bias is $10^{-11}$ A or less, and photocurrent under light irradiation of 1W/cm$^2$ intensity at wavelength 850 nm is $10^{-10}$ A or more.

The semiconductor device according to item 50 of the present invention is characterized in that in the semiconductor device as described in item 44, the semiconductor device is a semiconductor integrated circuit, and the device characteristic is at least one of frequency characteristic, noise characteristic, amplification characteristic, and power consumption characteristic.

Further, a production method of semiconductor device according to item 51 of the present invention is a method of producing a semiconductor device comprising an insulating underlay and a silicon layer formed thereon the method comprising:

(a) a step of forming a first silicon layer on the insulating underlay;

(b) a step of performing a first ion implantation to the first silicon layer to make a deep part of interface amorphous, and recrystallizing the amorphous layer by a first heat treatment;

(c) a step of epitaxially growing a silicon layer on the first silicon layer to form a second silicon layer;

(d) a step of performing a second ion implantation to the second silicon layer to make a deep part of interface amorphous, and recrystallizing the amorphous layer by a second heat treatment; and (e) after heat treating the silicon layer formed in the step (d) in an oxidizing atmosphere to oxidize part of surface side, a step of removing the formed silicon oxide film by etching to adjust the silicon layer to a desired thickness.

Still further, a production method of semiconductor device according to item 52 of the present invention is a method of producing a semiconductor device comprising an insulating underlay and a silicon layer formed thereon, the method comprising:

(a) a step of forming a first silicon layer on the insulating underlay;

(b) a step of performing a first ion implantation to the first silicon layer to make a deep part of interface amorphous, and recrystallizing the amorphous layer by a first heat treatment;

(c) a step of heat treating the recrystallized first silicon layer in an oxidizing atmosphere to oxidize part of surface side;

(d) a step of removing the silicon oxide film formed in the step (c) by etching;

(e) a step of epitaxially growing a silicon layer on the remaining first silicon layer to form a second silicon layer;

(f) a step of performing a second ion implantation to the second silicon layer to make a deep part of interface amorphous, and recrystallizing the amorphous layer by a second heat treatment;

(g) after heat treating the silicon layer formed in the step (f) in an oxidizing atmosphere to oxidize part of surface side, a step of removing the formed silicon oxide film by etching to adjust the silicon layer to a desired thickness.

The production method of semiconductor device according to item 53 of the present invention is characterized in that in the production method of semiconductor device as described in item 52, when forming the remaining first silicon layer to a predetermined thickness, the steps (c) to (d) are repeated two times or more.

The production method of semiconductor device according to item 54 of the present invention is characterized in that in the production method of semiconductor device as described in any one of items 52 to 53, the silicon layer formed in the step (f) is regarded as the recrystallized first silicon layer formed in the step (b), and the steps (c) to (f) are repeated two times or more.

Further, a production method of semiconductor device according to item 55 of the present invention is a method of producing a semiconductor device comprising an insulating underlay and a silicon layer formed thereon, the method comprising:

(a) a step of forming a first silicon layer on the insulating underlay;

(b) a step of heat treating the first silicon layer in an oxidizing atmosphere to oxidize part of surface side;

(c) a step of removing the silicon oxide film formed in the step (b) by etching;

(d) a step of epitaxially growing a silicon layer on the remaining first silicon layer to form a second silicon layer;

(e) a step of ion implanting to the second silicon layer to make a deep part of interface amorphous, and recrystallizing the amorphous layer by heat treatment; and (f) after heat treating the silicon layer formed in the step (e) in an oxidizing atmosphere to oxidize part of surface side, a step of removing the formed silicon oxide film by etching to adjust the silicon layer to a desired thickness.

The production method of semiconductor device according to item 56 of the present invention is characterized in that in the production method of semiconductor device as described in item 55, when forming the remaining first silicon layer to a predetermined thickness, the steps (b) to (c) are repeated two times or more.

The production method of semiconductor device according to item 57 of the present invention is characterized in that in the production method of semiconductor device as described in any one of items 55 to 56, the silicon layer formed in the step (e) is regarded as the first silicon layer formed in the step (a), and the steps (b) to (e) are repeated two times or more.

The production method of semiconductor device according to item 58 of the present invention is characterized in that in the production method of semiconductor device as described in any one of items 51 to 57, after the step of ion implanting to the second silicon layer to make a deep part of interface amorphous and recrystallizing the amorphous layer by heat treatment, or after the step of epitaxially growing the silicon layer to form a second silicon layer, further comprising a step of heat treatment in hydrogen.

The production method of semiconductor device according to item 59 of the present invention is characterized in that in the production method of semiconductor device as described in any one of items 51 to 57, after the step of ion implanting the second silicon layer to make a deep part of interface amorphous and recrystallizing the amorphous layer by heat treatment, surface of the silicon layer is flattened by chemical and/or mechanical polishing.

BEST MODE FOR PRACTICING THE INVENTION

Figure 1A:
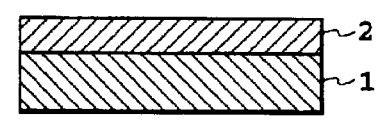
FIGS. 1A to 1H are sectional diagrams of SOS substrate in production process showing production procedures of the semiconductor substrate according to the invention described in item 10 of the present invention.
Figure 1B:
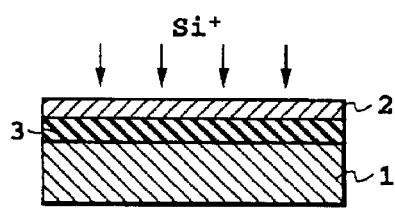
Figure 1C:
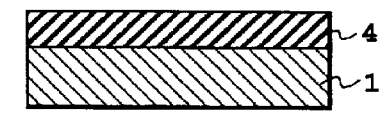
Figure 1D:
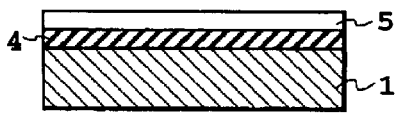
Figure 1E:
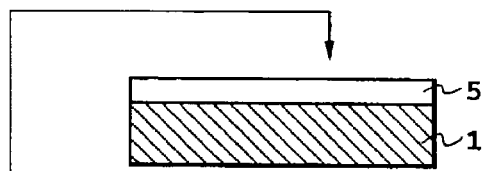
Figure 1F:
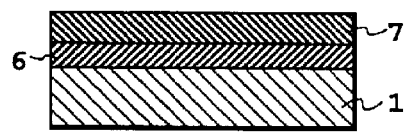
Figure 1G:
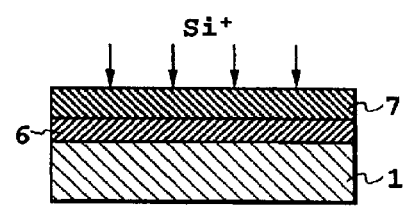
Figure 1H:

The present invention will be described in detail in the following.

As the insulating underlay in the present invention, a single crystal oxide substrate such as sapphire, a crystalline oxide layer such as $\alpha\text{-}Al_2O_3$, $\gamma\text{-}Al_2O_3$, $\theta\text{-}Al_2O_3$, $MgO\cdot Al_2O_3$, $CeO_2$, $SrTiO_3$, $(Zr_{1-x},Y_x)O_y$, $Pb(Zr, Ti)O_3$, $LiTaO_3$, and $LiNbO_3$, or a crystalline fluoride layer such as $CaF_2$ stacked on a silicon substrate as the substrate is used. Further, in the present invention, as the insulating underlay, an amorphous material, for example, a glass substrate or $SiO_2$ or the like on a silicon substrate as the substrate is also applicable.

Still further, in the present invention, method of growing an oxide layer or a fluoride layer on the silicon substrate is not specifically limited, normally a low pressure chemical vapor deposition method (LPCVD method), and an ultra-high-vacuum chemical vapor deposition method (UHV-CVD method), a molecular-beam epitaxy method (MBE method), a sputtering method, a laser MBE method or the like is used. For the case of $SiO_2$, a silicon substrate thermally oxidized in an oxidizing atmosphere can be used.

FIG. 1 shows a production procedure of SOS substrate of a practical semiconductor substrate according to item 10 of the present invention.

In the present invention, first, on a sapphire substrate 1, a first silicon layer 2 is epitaxially grown (a), as the growing method, an atmospheric pressure vapor deposition method (VD method), a low pressure chemical vapor deposition method (LPCVD method), an ultra-high-vacuum chemical vapor deposition method (UHV-CVD method), a molecular-beam epitaxy method (MBE method), an electron beam (EB) deposition method or the like is used. In particular, the epitaxial growth method is preferable. In this case, although thickness of the first silicon layer is not specifically limited, for example, a range from 0.03 $\mu$m to 1 $\mu$m is practicable.

After epitaxially growing the first silicon layer 2, silicon ion is implanted as a first ion implantation to make its deep part 3 amorphous (b), annealing is performed as a first heat treatment to form a silicon layer 4 recrystallized from surface layer (c). Although silicon ion implantation condition depends on film thickness of silicon layer, it is preferable to perform ion implantation in a condition that about 80% of silicon layer from interface with the insulating underlay is made amorphous. Annealing in recrystallization is preferably a process that after heat treatment in a nitrogen atmosphere or an oxidizing atmosphere in the range from 500° C. to 1000° C. or after heat treatment in a nitrogen atmosphere, heat treating in an oxidizing atmosphere. During recrystallization, to decrease the effect of thermal stress caused by a difference in thermal expansion coefficient between the silicon layer and the insulating underlay, it is preferable to perform a two-stage annealing that, first, annealing is performed at a relatively low temperature, and subsequently, annealing is performed at a higher temperature. Next, the recrystallized silicon layer 4 is heat treated in an oxidizing atmosphere to form a silicon oxide film 5 on the surface (d) in which rearrangement of the atoms takes place by the heat treatment, consequently, dislocations or stacking faults due to lattice nonuniformity at the interface, which are generated in the first silicon layer after epitaxial growth, are reduced, or parts having a different orientation disappear.

In the present invention, temperature of heat treatment in an oxidizing atmosphere is 500° C. or more and 1350° C. or less, preferably 600° C. or more and 1300° C. or less. If the temperature is too low, effect of rearrangement of atom is reduced, and, on the other hand, if the temperature is too high, there is a problem in that component elements of the underlay diffuse into the silicon layer. Further, when the temperature of the heat treatment in an oxidizing atmosphere is high, a donor type defect generates in the silicon layer. For example, in a MOSFET, problems such as the deviation of operation start voltage, that is, deviation of threshold voltage may be generated. Thus, it is preferable to perform a two-stage heat treatment at different temperatures of high-temperature heat treatment for heat treatment in an oxidizing atmosphere at a high temperature, and subsequent low-temperature heat treatment for heat treatment in an oxidizing atmosphere at a lower temperature, which is preferable in forming a higher reliability semiconductor device on the semiconductor substrate according to the present invention. In the case of performing a two-stage heat treatment at different temperatures, the preferable temperature of the high-temperature heat treatment is 800° C. or more and 1200° C. or less, and preferable temperature of low-temperature heat treatment is 700° C. or more and 1100° C. or less.

Further, the heat treatment atmosphere is not specifically limited if it is an oxidizing atmosphere, oxidizing gases such as $O_2$, $O_2+H_2$, $H_2O$, $N_2O$ or a gas atmosphere in which these oxidizing gases are diluted with an inert gas such as $N_2$ or Ar is normally used. However, it is preferable to use $O_2+H_2$ mixed gas or a gas including $H_2O$, since a greater effect is obtained in terms of reduction of crystalline defects or improvement of crystallinity. This is considered as due to the fact that heat treatment in an oxidizing atmosphere, in addition to the effect of the rearrangement of atoms, has an effect that when the silicon layer is oxidized to form a silicon oxide film, interstitial silicon atoms are produced in the vicinity of the surface of the silicon layer, which diffuse into the silicon layer to fill the silicon vacancy, thereby removing stacking faults or the like. When the heat treatment atmosphere is $O_2+H_2$ mixed gas or a gas including $H_2O$, the generation speed of the interstital silicon atom increases in the vicinity of the silicon layer surface, thereby obtaining a greater effect in terms of the crystalline defect reduction or improvement of crystallinity.

Next, the silicon oxide layer 5 is removed by etching with hydrof luoric acid or buffered hydrof luoric acid (BHF) or the like. A great reduction in crystalline defects or improvement of crystallinity can be obtained by preparing a first silicon layer to a predetermined thickness, and performing the step (d) of heat treating the silicon layer 4 in an oxidizing atmosphere to form the silicon oxide layer 5 on the surface and then the step (e) of removing the silicon oxide layer 5 by etching and repeating steps (d) and (e) two or more times. Thus, the chance for the oxidizing gas to contact the silicon layer surface increases, and the generation speed of interstitial silicon atom increases in the vicinity of the silicon layer surface.

After that, using the remaining silicon layer 6 as a seed layer, further thereon, the silicon layer 7 is homoepitaxially grown (f). As the growth method at this time, as in the first silicon layer, APCVD method, LPCVD method, UHV-CVD method, MBE method, EB deposition method and the like are used, however, it is not required to be the same method as the first silicon layer 2. This stacking is the same as homoepitaxial growth for stacking silicon layer on the silicon single crystal substrate, which is not affected by the difference in lattice constant. In addition, it also has an effect of decreasing the growing temperature, and, as compared with the silicon layer proposed by the prior art heteroepitaxial growth, the crystallinity or surface flatness is improved. When the silicon layer 7 is homoepitaxially grown, it is important that in the initial stage of growth, a silicon oxide layer disturbing epitaxial growth of silicon does-not exist on the seed layer surface. For this purpose, it is preferable that the content of water or oxygen is as small as possible in the growing atmosphere. As the growing method, a method capable of growing the silicon layer at a base pressure when the raw material is not supplied is $10^{-7}$ Torr or less, and under an ultra-high-vacuum atmosphere as in the UHV-CVD method, and MBE method, is preferable.

Further, it is preferable to perform heat treatment in a hydrogen atmosphere or in vacuum for removing native oxide film or chemical oxide on the seed layer 6 before performing homoepitaxial growth of the silicon layer 7.

Temperature of performing epitaxial growth of the silicon layer 7 is normally 400° C. or more and 1200° C. or less, preferably 550° C. or more and 1050° C. or less. Formation of silicon oxide layer on the seed layer surface is determined by the existence of water or oxygen in the growing atmosphere and growing temperature, the smaller the existence of water or oxygen in the growing atmosphere, the more difficult it is to form silicon oxide layer at a low temperature. Therefore, in a method capable of growing the silicon layer in an ultra-high-vacuum atmosphere such as UHV-CVD method or MBE method, it is possible to perform epitaxial growth at a relatively low temperature, however, in this case, because thermal stress becomes small, high quality crystal silicon layer is easily obtained, which is preferable. Further, when the base pressure is $10^{-7}$ Torr or more in APCVD method or LPCVD method, to suppress formation of silicon oxide layer, it is effective for performing good epitaxial growth to use a temperature profile that a high growth temperature is used in the initial stage of growth, and the growth temperature is decreased from the halfway.

Thickness of the seed layer 6 for homoepitaxial growth of the silicon layer 7 in the present invention is not specifically limited, it is preferably 5 nm or more and 11 μm or less.

Next, to the second silicon layer (6+7), silicon ion is again implanted as a second ion implantation (g) to make its deep part amorphous, and annealing is performed as a second heat treatment to form a silicon layer 8 recrystallized from the surface layer (h). When, in the present invention, after the silicon layer is made amorphous, recrystallized by the second heat treatment, since recrystallization progresses in the interface direction from the silicon layer surface to the insulating layer, the better the crystallinity of the surface silicon layer and a higher crystallinity of the recrystallized silicon layer. Since the silicon layer 7 epitaxially grown on the seed layer formed by heat treatment in an oxidizing atmosphere is higher in crystallinity than the first epitaxial silicon layer, after making the second silicon layer amorphous, a highly crystalline silicon layer can be formed by recrystallization. Further, in FIG. 1, by repeating the steps from (d) to (h) two or more times, a remarkable effect can be achieved in terms of the reduction of the crystalline defect density, improvement of crystallinity, reduction of surface roughness and the like.

In the present invention, it is preferable to perform the heat treatment in a hydrogen atmosphere to the first silicon layer 2 or the above recrystallized silicon layer 8, since silicon atoms migrate on the surface to cause rearrangement of crystal thereby achieving reduction of crystal defect or improvement of surface flatness. When the temperature of the heat treatment in a hydrogen atmosphere is too low, surface migration of silicon atom does not sufficiently generate, and when it is too high, a large amount of component atoms of the underlay (for example, Al in the case of sapphire) diffuse into the silicon layer to lower the crystallinity of silicon layer or change the carrier density. Therefore, it is preferable to heat to a temperature of 700° C. or more and 1300° C. or less, preferably 800° C. or more and 1200° C. or less.

Further, the hydrogen partial pressure during the heat treatment can be selected in the range from 1 Torr to 760 Torr. The partial pressure can be adjusted by evacuation by a vacuum pump or dilution using an inert gas.

Although the time of heat treatment in hydrogen can be optionally selected, it is preferably 2 minutes to 5 hours more preferably 5 minutes to 3 hours.

When after recrystallizing by annealing of second heat treatment, it is preferable that the surface of the silicon layer 8 is flattened. This results in a good effect for device performance or reliability. As the method of flattening, heat treatment in a hydrogen atmosphere as described above or chemical and/or mechanical polishing is preferable.

When single crystalline oxide substrates such as sapphire substrate, and SOI substrates using the insulating underlay of silicon substrates and crystalline oxide layers such as α-$Al_2O_3$, γ-$Al_2O_3$, θ-$Al_2O_3$, MgO.$Al_2O_3$, $CeO_2$, $SrTiO_3$, ($Zr_{1-x}$,$Y_x$)$O_y$, Pb(Zr, Ti)$O_3$, $LiTaO_3$, and $LiNbO_3$ stacked thereon or a laminated substrate comprising a crystalline fluoride layer such as $CaF_2$ stacked thereon are immersed in an etching solution mixing $I_2$, KI, HF, methanol, and water to form pits, and then the number of pits per unit area is measured using a scanning electron microscope (SEM) to determine crystalline defect density of silicon layer, even when thickness of the silicon layer is as small as 0.03 μm to 0.7 μm, a value of $7\times10^6$/$cm^2$ or less is obtained over the entire depth direction of the silicon layer.

The inventive silicon layer has an X-ray diffraction rocking curve full width at half maximum of a silicon (004) peak parallel to the substrate surface is 0.24 degree or less and 0.03 degree or more, and the X-ray diffraction rocking curve full width at half maximum of a silicon (040) peak perpendicular to the substrate surface is 0.18 degree or less and 0.03 degree or more, and smaller than the X-ray diffraction rocking curve full width at half maximum of a silicon (040) peak. Further, the X-ray diffraction rocking curve full width at half maximum of a silicon (040) peak perpendicular to the substrate surface of the silicon layer is almost constant over the entire depth direction and shows a value of 0.18 degree or less and 0.03 degree or more.

In the present invention, the surface roughness indicates root mean square roughness Rrms in the area of 10 μm×10 μm measured using an atomic force microscope, and surface roughness of SOI substrate as the semiconductor substrate produced by the present invention is all 2 nm or less.

Since, according to the present invention, on the single crystalline oxide substrate such as sapphire or crystalline oxide layers such as α-$Al_2O_3$, γ-$Al_2O_3$, θ-$Al_2O_3$, MgO.$Al_2O_3$, $CeO_2$, $SrTiO_3$, ($Zr_{1-x}$,$Y_x$)$O_y$, Pb(Zr, Ti)$O_3$, $LiTaO_3$, and $LiNbO_3$ or a crystalline fluoride layer such as $CaF_2$ stacked thereon, a silicon layer of very small crystalline defect density and good surface flatness can be produced, on this SOI substrate, a semiconductor device having superior performance that cannot be obtained with the same prior art material composition can be formed.

The semiconductor device, as described in items 51 to 59, is obtained by including a substrate quality improving step for improving the crystallinity or surface flatness of the SOI substrate as the semiconductor substrate as a prestage, and subsequent steps may be those taught by the prior art.

In the semiconductor device in the present invention, the type thereof is not specifically limited, and includes all types of silicon devices, such as MOSFET, bipolar transistor, BiCMOS transistor combining both, thin film transistor (TFT), diode, solar cell, and the like. Further, MOSFET and integrated circuits composed of the above devices may be included.

For example, when a MOSFET is formed on the SOS substrate, the silicon layer on which the MOSFET is formed is small in crystalline defect density or surface roughness, the carrier is less subjected to scattering during movement in channel, and the effective mobility or trans-conductance is increased.

Further, the flicker noise is said to be due to a fluctuation of mobility when the moving carrier is scattered by crystalline defects in the silicon layer, or due to a process of capture and detachment of moving carriers through a trap generated on the interface of the silicon layer having a surface roughness and gate oxide film formed thereon. By reducing the crystalline defects and surface roughness of the silicon layer, low flicker noise can be achieved.

Still further, when a gate oxide film constituting MOSFET is produced by thermal oxidation of the silicon layer, if the crystalline defect density or surface roughness is large as in the prior art, the thickness of the $SiO_2$ film after thermal oxidation becomes uneven, or pin peel or a weak spot is included in the film, which results in a reduction of the insulation resistance. In the present invention, since the silicon layer on which the MOSFET is formed is low in crystalline defect density and small in surface roughness, defects of $SiO_2$ film after thermal oxidation are small, and it has a high gate insulation breakdown voltage.

Yet further, by reducing crystalline defect density of the silicon layer on which a MOSFET is formed, the current passes through the defects is small. Therefore, when the MOSFET is in an OFF state, leakage current flowing between the source and drain can be reduced, and a high electrostatic breakdown voltage (electrostatic discharge) is obtained.

In addition, as described above, the SOI structures of the prior art have been high in snap back breakdown voltage of MOSFET as compared with bonded SOI substrate or a SIMOX substrate in which an underlay of the silicon layer is $SiO_2$, however, by the present invention, because crystalline defect of silicon layer is reduced, leakage current between the source and drain is decreased, and during heat treatment at high temperature, Al as a component element of the underlay diffuses in the silicon layer to form a hot carrier killer level in the vicinity of interface to suppress accumulation of hot carrier at the body part, an even higher snap back breakdown voltage is obtained.

In the present invention, when a MOSFET of gate length 0.8 $\mu$m is formed on the SOI substrate as semiconductor substrate of a silicon layer thickness of 0.03 $\mu$m or more and 0.7 $\mu$m or less, characteristics are obtained that no kink appears in the current—voltage characteristic, drain breakdown voltage is 7V or more, and input gate voltage spectral density representing flicker noise is $3\times10^{-12}$ $V^2$/Hz or less at a measuring frequency of 100 Hz.

As described above, an integrated circuit formed from the MOSFET having a high performance and high reliability on the SOS substrate, in the same design rule, can provide very superior characteristics as compared with the prior art, such as high operation speed, low noise, good amplification characteristics, high reliability and the like. For this reason, it can be utilized in various applications such as mobile communication high-frequency parts, satellite LSI, analog/digital converter devices (ADC, DAC), optical transmission LSI, analog—digital mixed LSI and the like. Thus, it is a very useful device.

Further, when a bipolar transistor is formed on an SOS substrate as in the present invention with a MOSFET device, characteristics such as trans-conductance, cut-off frequency, collector current, leakage current, current gain and the like are improved.

Still further, when an optical device such as a photodiode, optical waveguide, various optical image sensors or the like is formed on the SOS substrate as in the present invention, there is a reduction of the crystalline defect density and surface roughness of the silicon layer on which the optical device is formed. For example, the current passing through crystalline defects is small. Also, since recombination of carriers such as electrons or positive holes generated by light absorption is difficult to take place, in the photodiode or optical image sensor, dark current when light is not applied is low, and photocurrent during irradiation is high. Yet further, because light scattering due to crystal defects or surface roughness is small, the optical waveguide is small in propagation loss.

In the present invention, on the SOI substrate as a semiconductor substrate having a thickness of the silicon layer of 0.03 $\mu$m or more and 0.7 $\mu$m or less, when a pin photodiode with a pin area width of each 1 $\mu$m is formed, the dark current measured using a 2V reverse bias is $10^{-11}$ A or less, and the photocurrent under-light irradiation at an intensity 1W/$cm^2$ at wavelength 850 nm is $10^{-10}$ A or more. As described above, in the SOI substrate of the prior art, a sufficiently practicable photodiode was not obtained, however, with the present invention, the dark current is reduced and the photocurrent is increased, and it becomes possible to obtain a practicable photodiode on the SOI substrate.

In the following, embodiments of the present invention and comparative examples will be shown.

EMBODIMENT 1

On a R-plane sapphire substrate, by a LPCVD method using monosilane ($SiH_4$) gas as a source material, a first silicon layer was grown to a thickness of 280 nm at a growing temperature of 950° C. This first silicon layer was implanted with silicon ion of energy 190 keV in an amount of $1\times10^{16}$/$cm^2$ as a first ion implantation while maintaining the substrate temperature at 0° C. to make the interface side with sapphire amorphous. After that, as a first heat treatment, in a nitrogen gas atmosphere, heat treatment at temperature 550° C. for 30 minutes, then at temperature 900° C. for 60 minutes was performed to recrystallize the silicon layer. Next, the resulting product was introduced in an oxidation furnace, and subjected to water vapor oxidation at 1000° C. for 60 minutes. Then, after immersing in BHF to remove oxide film, it was again water vapor oxidized at 900° C. for 50 minutes. This oxide film was removed, and the thickness of the silicon layer after removal was 100 nm.

Next, on the remaining silicon layer, by a LPCVD method using monosilane as raw material, a silicon layer was stacked at a growing temperature of 950° C. to form a second silicon layer. Here, when a total film thickness of the second silicon layer was measured, it was 280 nm. To the second silicon layer, as a second ion implantation, while maintaining the substrate temperature at 0° C., silicon ion of energy 190 keV was implanted to $1\times10^{16}$/$cm^2$ to make the interface side with sapphire amorphous. After that, as a second heat treatment, heat treatment was performed in a nitrogen gas atmosphere at temperature 550° C. for 30 minutes, then at temperature 900° C. for 60 minutes to recrystallize the silicon layer. Next, the resulting product was introduced in an oxidation furnace, and subjected to water vapor oxidation at 1000° C. for 60 minutes. Then, after the product was immersed in BHF to remove the oxide film, again water vapor oxidized at 900° C. for 50 minutes. This oxide film was removed, and the thickness of the silicon layer after removal was 100 nm.

To evaluate the crystallinity of the SOS substrate, the number of pits per unit area was measured using a scanning electron microscope (SEM) to determine crystalline defect density using the following procedure.

(1) The substrate was ultrasonically cleaned in methanol,
(2) natural oxide layer on the surface was removed using 2% HF aqueous solution,
(3) overflowed with pure water,
(4) the substrate was immersed for 45 seconds in an etching solution mixed in a ratio of $I_2$(4 g)+KI(12 g)+methanol(40 cc)+$H_2O$(40 cc)+HF(3 cc),
(5) after overflowing with pure water, the above (2) and (3) were repeated.

As a result, crystal defect density was $5.0\times10^6/cm^2$.

Further, the resulting SOS substrate was measured for rocking curve half widths of (004) plane parallel to the substrate and perpendicular (040) plane using a high resolution X-ray diffraction apparatus.

Figure 2:
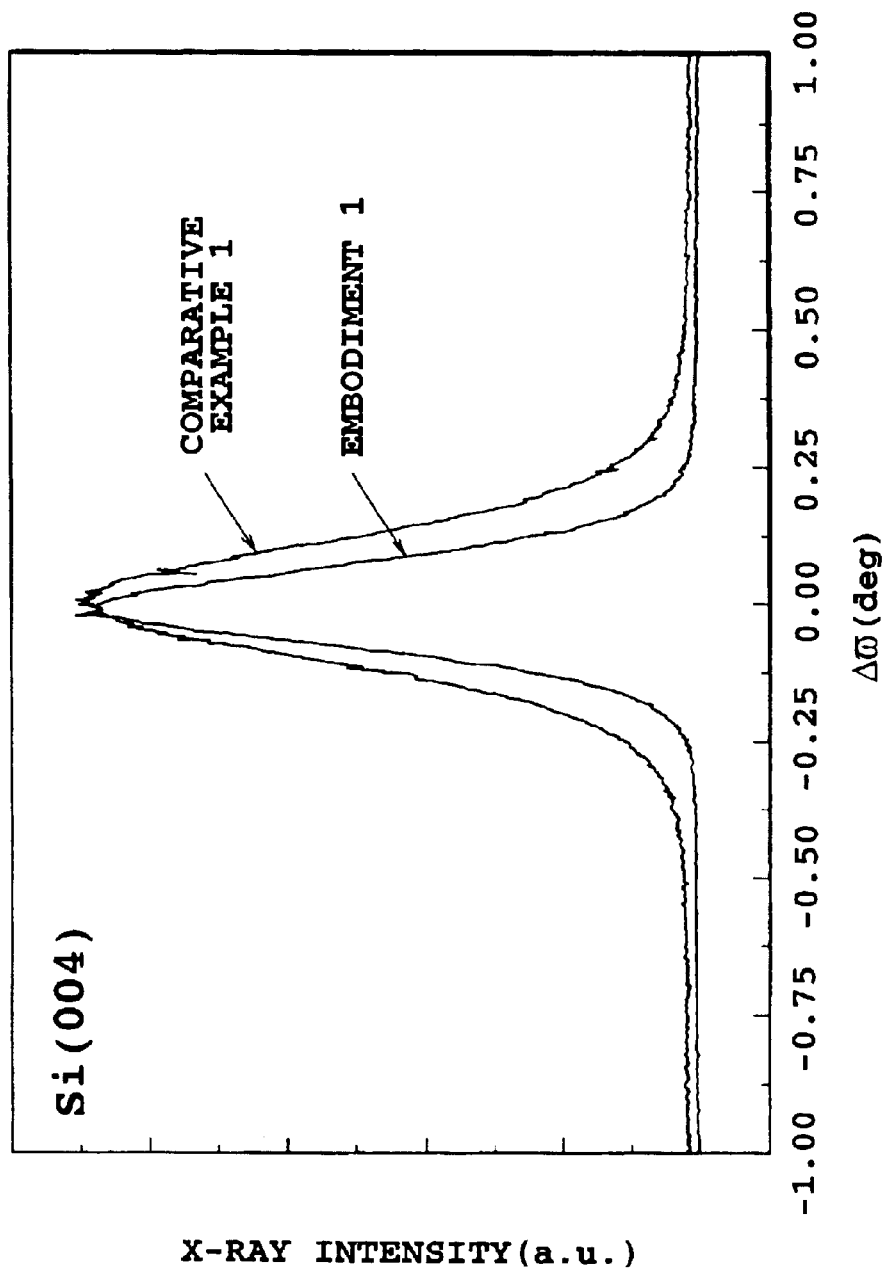
FIG. 2 is X-ray diffraction rocking curves of a silicon (004) peak parallel to the substrate surface and a silicon (040) peak perpendicular to the substrate surface of the SOS substrates produced in Embodiment 1 and Comparative Example 1 of the present invention.
Figure 3:
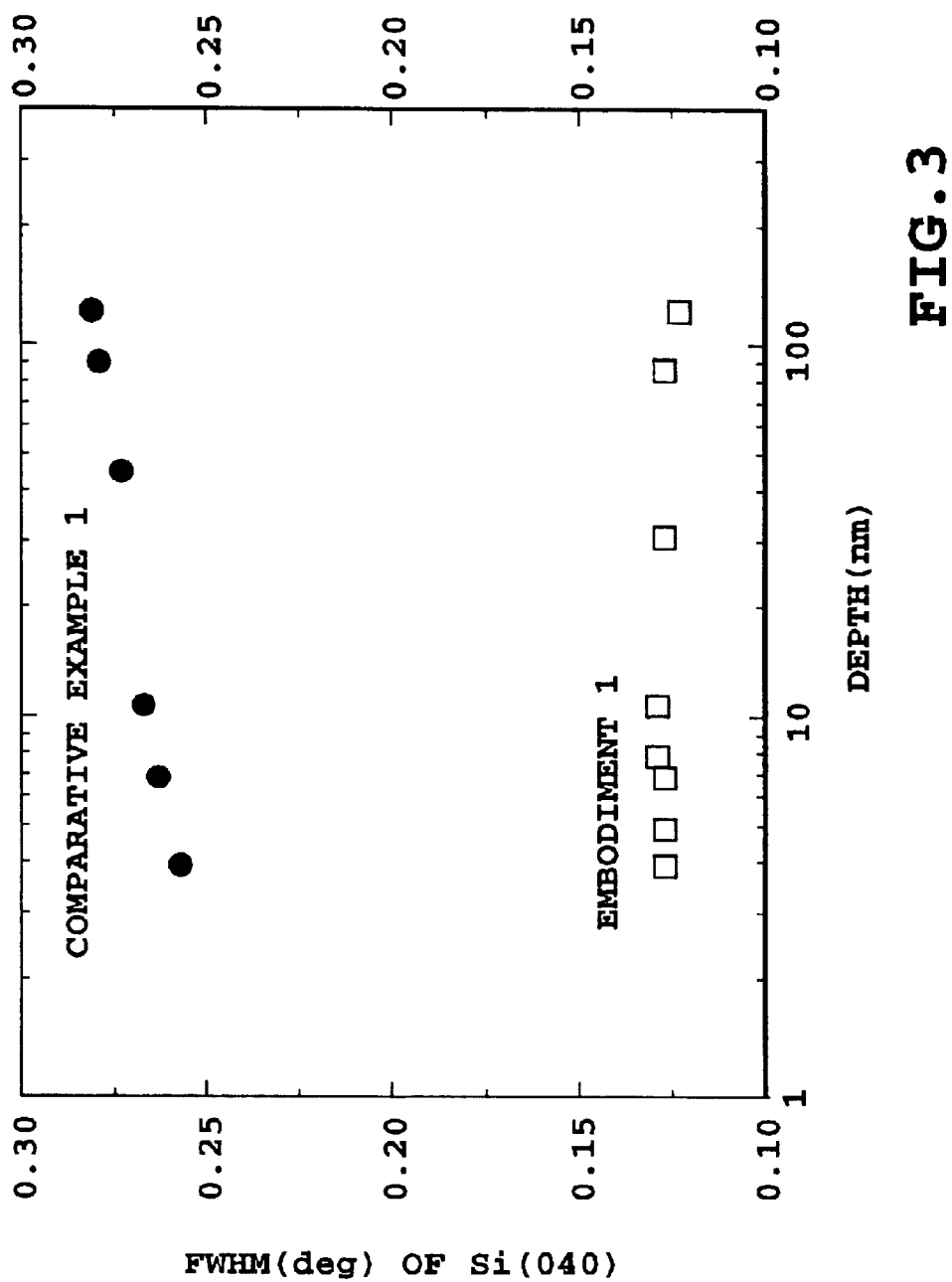
FIG. 3 is a graph showing changes in: depth direction of X-ray diffraction rocking curve full width at half maximum of a silicon (040) peak perpendicular to the substrate surface of the SOS substrates produced in Embodiment 1 and Comparative Example 1 of the present invention.

As a result, a curve as shown in FIG. 2 was obtained, the (004) plane half width determined from the figure was 0.182 degree, and the (040) plane half width was 0.126 degree. Further, as shown in FIG. 3, the (040) plane half width was constant in the depth direction, and the crystallinity was uniform in the depth direction of the silicon layer.

Still further, when surface roughness (Rrms) of the silicon layer was measured by an interatomic force microscope, it was 1.4 nm.

Figure 4:
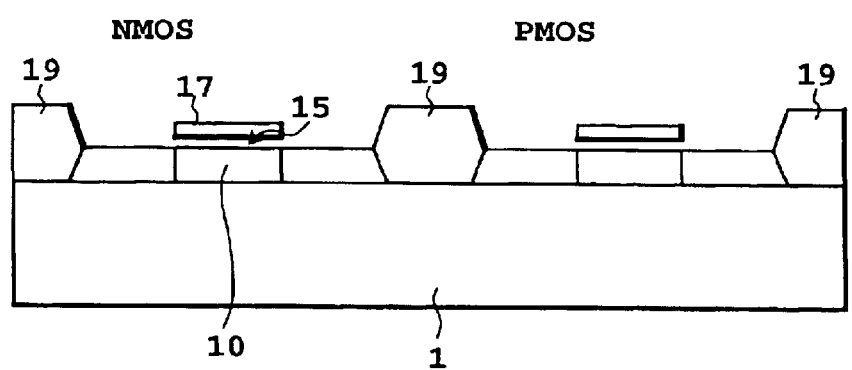
FIG. 4 is a sectional construction diagram of a MOSFET produced using the SOS substrate produced in Embodiment 1 of the present invention.

Next, on the resulting SOS substrate, using a CMOS process, an n-type MOSFET of gate 17 width 50 microns and gate 17 length 0.8 micron was produced. A sectional diagram of the device is shown in FIG. 4. In this case, LOCOS (Local Oxidation) 19 was used for device separation, and thickness of gate oxide film 15 was 8 nm. To the channel 10, $BF_2^+$ at energy 35 keV was implanted in an amount of $6.0\times10^{12}cm^2$.

Figure 5:
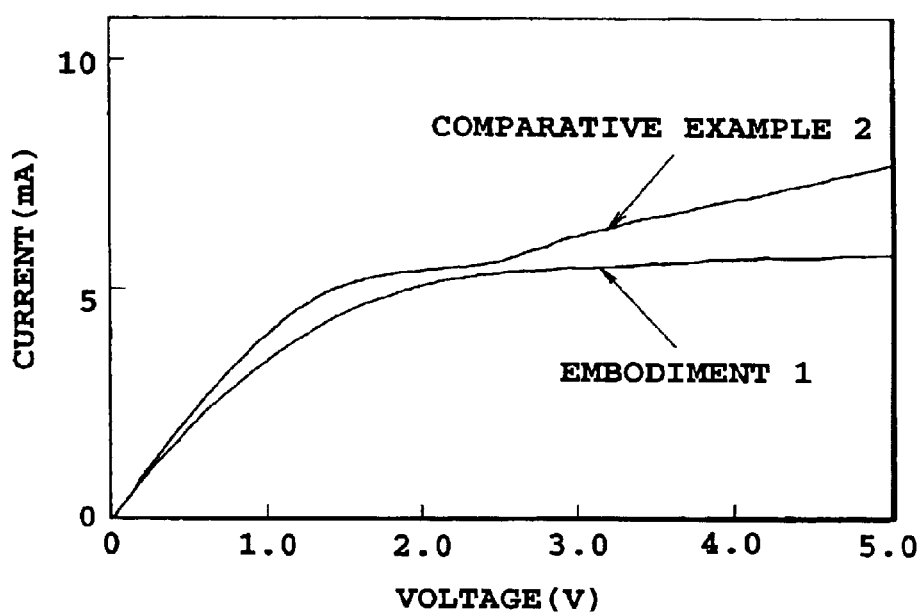
FIG. 5 is a diagram representing current—voltage characteristic of NMOSFET produced using SOS substrate produced in Embodiment 1 of the present invention and using a commercial bonded SOI substrate of Comparative Example 1.
Figure 6:
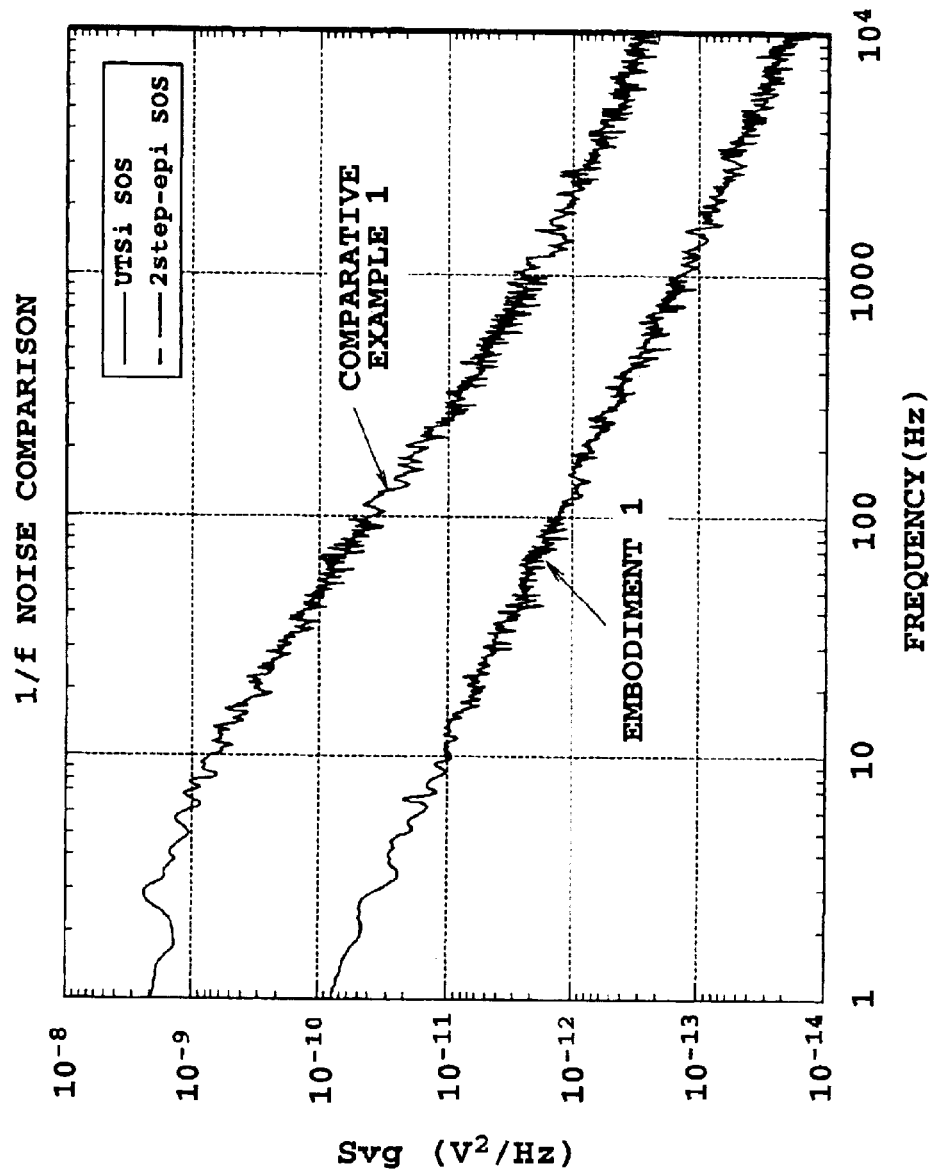
FIG. 6 is a diagram representing flicker noise characteristic of NMOSFET produced using SOS substrates produced in Embodiment 1 of the present invention and Comparative Example 1.

This n-type MOSFET had a threshold voltage of 0.7V, and, as can be seen from current—voltage curve in FIG. 5, fluctuation of drain current due to kinks was not noted. Further, the drain breakdown voltage was 7.5V. As for the flicker noise characteristics, as shown in FIG. 6, evaluation was performed for input gate voltage spectral density (Svg), when measured in a condition of measuring frequency of 100 Hz, gate voltage of threshold voltage+0.3V, and drain voltage of 1V, Svg was $1.0\times10^{-12}$ $V^2/Hz$.

Further, as a result of measuring the interface level density Nss by a charge pumping method by frequency sweep using triangular wave pulse, it was $1.0\times10^{11}/cm^2$.

Figure 7:
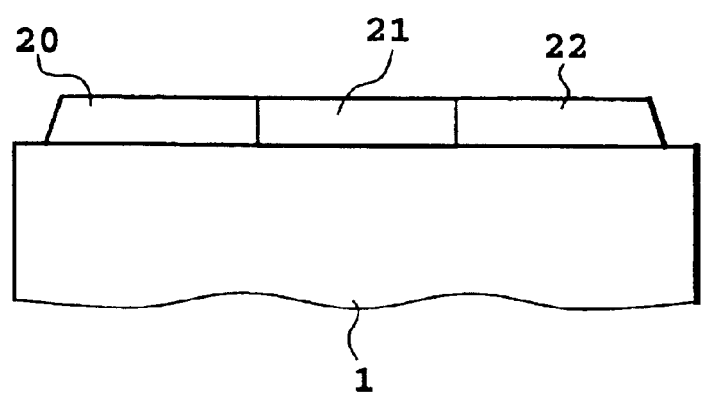
FIG. 7 is a sectional construction diagram of a pin photodiode produced using the SOS substrate produced in Embodiment 1 of the present invention.

Yet further, a photodiode was produced on the resulting SOS substrate. A sectional diagram of the device is shown in FIG. 7. The device was formed in a p-i-n structure in the horizontal direction of the substrate 1, the size of the i-type area 21 was length 75 micron and width 1 micron. To the n-type area 20, As+0 at energy 35 keV of $2.0\times10^{15}/cm^2$ was implanted. Further, to the p-type area 22, $BF_2^+$ at energy 35 keV of $2.0\times10^{15}/cm^2$ was implanted. When a 2V bias is applied to the n-type area, dark current was $2.7\times10^{-12}$ A, photocurrent under light irradiation of intensity $1W/cm^2$ at wavelength 850 nm was $4.8\times10^{-10}$ A.

COMPARATIVE EXAMPLE 1

On a R-plane sapphire substrate, by a LPCVD method using monosilane ($SiH_4$) gas as a source material, a first silicon layer was stacked to a thickness of 280 nm at a growing temperature of 950° C. This first silicon layer was implanted with silicon ion of energy 190 keV in an amount of $1\times10^{16}/cm^2$ while maintaining the substrate temperature at 0° C. to make the interface side with sapphire amorphous. After that, in a nitrogen gas atmosphere, heat treatment at temperature 550° C. for 30 minutes, then at temperature 900° C. for 60 minutes was performed to recrystallize the silicon layer. Next, the resulting product was introduced in an oxidation furnace, and subjected to water vapor oxidation at 1000° C. for 60 minutes. Then, after it was immersed in BHF to remove the oxide film, it was again water vapor oxidized at 900° C. for 50 minutes. This oxide film was removed, and the thickness of the silicon layer after removal was 100 nm.

When the resulting substrate was measured for crystalline defect density and rocking curve full width at half maximum by the same method as in Embodiment 1, the crystal defect density was $4.3\times10^8/cm^2$, and as shown in FIG. 2, the (004) plane full width at half maximum was 0.270 degree and the (040) plane full width at half maximum was 0.278 degree. Further, as shown in FIG. 3, the (040) plane full width at half maximum increased as approaching the interface of silicon layer with sapphire. Still further, the surface roughness (Rrms) of the silicon layer was 2.5 nm.

When, using this substrate, a n-type MOSFET was produced as in Embodiment 1, and transistor characteristic was measured, the threshold voltage was 0.7 V, variation of drain current due to kink effect was not noted, and the drain breakdown voltage was 7.3 V. Yet further, when flicker noise and interface level density were measured as in Embodiment 1, Svg was $3.2\times10^{-11}$ $V^2/Hz$, and Nss was, as shown in FIG. 6, $5.0\times10^{11}/cm^2$.

Yet further, when a photodiode was produced as in Embodiment 1, and measured for dark current and photocurrent similarly, dark current was $1.4\times10^{-11}$ A and photocurrent was $9.2\times10^{-11}$ A.

COMPARATIVE EXAMPLE 2

Using a commercial bonded SOI with a silicon layer film thickness of 100 nm, a n-type MOSFET was produced and evaluated for transistor characteristic in the same condition as Embodiment 1. Threshold voltage was 0.7 V, however, as can be seen from the current—voltage curve in FIG. 5, variation of the drain current due to kinks was observed. The drain breakdown voltage at this time was as low as 4.1 V. Further, when the flicker noise was measured, Svg was $3.7\times10^{-12}$ $V^2/Hz$.

EMBODIMENT 2

A SOS substrate was produced using the same procedure as in Embodiment 1 except that when forming the second silicon layer, the silicon layer was stacked at a growing temperature of 750° C. by the UHV-CVD method monosilane as a source material.

When the resulting substrate was measured for crystalline defect density and rocking curve full width at half maximum by the same method as in Embodiment 1, the crystal defect density was $2.5\times10^6/cm^2$, the (004) plane full width at half maximum was 0.167 degree, and the (040) full width at half maximum was 0.120 degree. The (004) plane full width at half maximum was constant in the depth direction, and crystallinity was uniform in the depth direction of the silicon layer. Further, the surface roughness (Rrms) of the silicon layer was 1.0 nm.

When, using this substrate, a n-type MOSFET was produced and evaluated for transistor characteristics as in Embodiment 1. The threshold voltage was 0.7 V, variation of drain current due to kinks was not noted, and the drain breakdown voltage was 7.7 V. Further, when the flicker noise and the interface level density were measured as in Embodiment 1, Svg was $9.2\times10^{-13}$ $V^2/Hz$ and Nss was $7.5\times10^{10}/cm^2$.

Still further, when a photodiode was produced as in Embodiment 1, and measured for dark current and photocurrent in the same condition, the results were $1.0\times10^{-12}$ A and $6.1\times10^{-10}$ A, respectively.

EMBODIMENT 3

A SOS substrate was produced using the same procedure as in Embodiment 1 except that after recrystallization by the first heat treatment, when the silicon layer was oxidized, oxidation was performed at 1000° C. for 10 hours instead of water vapor oxidation at 1000° C. for 60 minutes.

When the resulting substrate was measured for crystalline defect density and rocking curve full width at half maximum as in the same method as Embodiment 1, the crystalline defect density was $6.8 \times 10^6/cm^2$, the (004) full width at half maximum 0.205 degree and the (040) full width at half maximum 0.140 degree. The (040) full width at half maximum was constant in the depth direction, and the crystallinity was uniform in the depth direction of the silicon layer. Further, the surface roughness (Rrms) of the silicon layer was 1.5 nm.

When, using this substrate, a n-type MOSFET was produced as in Embodiment 1, and evaluated for transistor characteristics. The threshold voltage was 0.7 V, variation of drain current due to kink was not noted, and the drain breakdown voltage was 7.5 V. Further, when flicker noise and interface level density were measured as in Embodiment 1, the results were Svg $2.0 \times 10^{-12}$ $V^2/Hz$ and Nss $1.6 \times 10^{11}/cm^2$, respectively.

Still further, when a photodiode was produced as in Embodiment 1, and measured for dark current and photocurrent in the same condition, the results were $4.0 \times 10^{-12}$ A and $4.0 \times 10^{-10}$ A, respectively.

EMBODIMENT 4

On a R-plane sapphire substrate, by a LPCVD method using monosilane gas as a source material, a first silicon layer was stacked to a thickness of 280 nm at a growing temperature of 950° C. This first silicon layer was implanted with silicon ion of energy 190 keV in an amount of $1 \times 10^{16}/cm^2$ while maintaining the substrate temperature at 0° C. to make the interface side with sapphire amorphous. After that, in a nitrogen gas atmosphere, heat treatment at temperature 550° C. for 30 minutes, then at temperature 900° C. for 60 minutes was performed to recrystallize the silicon layer. Next, the resulting product was introduced in an oxidation furnace, and subjected to water vapor oxidation at 1000° C. for 60 minutes. Then, after immersing in BHF to remove the oxide film, it was again water vapor oxidized at 900° C. for 50 minutes. This oxide film was removed, and thickness of the silicon layer after removal was 200 nm.

Next, the resulting product was introduced in an oxidation furnace, and subjected to water vapor oxidation at 1000° C. for 21 minutes. After the product was immersed in BHF to remove oxide film, it was again water vapor oxidized at 900° C. for 50 minutes. Thickness of the silicon layer after removal of this oxide film was 100 nm.

Next, on the remaining silicon layer, by the LPCVD method using monosilane as a source material, a silicon layer was stacked at a growing temperature of 950° C. to form a second silicon layer. Here, when the total thickness of the second silicon layer was measured, it was 280 nm.

This second silicon layer was implanted with silicon ion of energy 190 keV in an amount of $1 \times 10^{16}/cm^2$ as a second ion implantation while maintaining the substrate temperature at 0° C. to make the interface side with sapphire amorphous. After that, as a second heat treatment, in a nitrogen gas atmosphere, heat treatment at 550° C. for 30 minutes, then at 900° C. for 60 minutes was performed to recrystallize the silicon layer. Next, the resulting product was introduced in an oxidation furnace, and subjected to water vapor oxidation at 1000° C. for 60 minutes. Then, after immersing in BHF to remove the oxide film, it was again water vapor oxidized at 900° C. for 50 minutes. Thickness of the silicon layer after removal of the oxide film was 100 nm.

When the resulting substrate was measured for crystalline defect density and rocking curve full width at half maximum in the same method as Embodiment 1, the crystalline defect density was $1.5 \times 10^6/cm^2$, the (004) plane full width at half maximum 0.168 degree and the (040) plane full width at half maximum 0.120 degree. The (040) full width at half maximum was constant in the depth direction, and the crystallinity was uniform in the depth direction of the silicon layer. Further, the surface roughness (Rrms) of the silicon layer was 1.3 nm.

When, using this substrate, a n-type MOSFET was produced as in Embodiment 19, and measured for transistor characteristics, the threshold voltage was 0.7 V, variation of drain current due to kink was not noted, and the drain breakdown voltage was 7.8 V. Further, when flicker noise and interface level density were measured as in Embodiment 1, the results were Svg $9.0 \times 10^{-13}$ $V^2/Hz$ and Nss $9.1 \times 10^{10}/cm^2$, respectively.

Still further, when a photodiode was produced as in Embodiment 1, and measured for dark current and photocurrent in the same conditions, the results were $9.3 \times 10^{-13}$ A and $6.5 \times 10^{-10}$ A, respectively.

EMBODIMENT 5

A SOS substrate was produced using the same procedure as in Embodiment 1 except that after recrystallizing the silicon layer by the second heat treatment in Embodiment 1, the resulting substrate was heat treated in a hydrogen gas atmosphere at a pressure 80 Torr at 1100° C. for 30 minutes.

When the resulting substrate was measured for crystalline defect density and rocking curve full width at half maximum in the same method as Embodiment 1, the crystalline defect density was $2.1 \times 10^6/cm^2$, the (004) plane full width at half maximum 0.165 degree and the (040) plane full width at half maximum 0.121 degree. The (040) full width at half maximum was constant in the depth direction, and the crystallinity was uniform in the depth direction of the silicon layer. Further, the surface roughness (Rrms) of the silicon layer was 0.7 nm.

When, using this substrate, a n-type MOSFET was produced as in Embodiment 1, and measured for transistor characteristics, the threshold voltage was 0.7 V, variation of drain current due to kinks was not noted, and the drain breakdown voltage was 7.8 V. Further, when flicker noise and interface level density were measured as in Embodiment 1, the results were Svg $8.8 \times 10^{-13}$ $V^2/Hz$ and Nss $6.0 \times 10^{10}/cm^2$, respectively.

Still further, when a photodiode was produced as in Embodiment 1, and measured for dark current and photocurrent in the same conditions, the results were $9.6 \times 10^{-13}$ A and $6.0 \times 10^{-10}$ A, respectively.

EMBODIMENT 6

A SOI substrate was produced using the same procedure as in embodiment 1 except that, as the substrate, instead of the R-plane sapphire, a substrate in which $\gamma$-$Al_2O_3$ was stacked at a substrate temperature of 880° C. using the URV-CVD method with trimethylaluminum and oxygen as source materials on a silicon (100) substrate.

When the resulting substrate was measured for crystalline defect density and rocking curve full width at half maximum in the same method as Embodiment 1, the crystal defect density was $6.7 \times 10^6/cm^2$, the (004) plane full width at half maximum 0.202 degree and the (040) plane full width at half maximum 0.143 degree. The (040) full width at half maximum was constant in the depth direction, and the crystallinity was uniform in the depth direction of the silicon layer. Further, the surface roughness (Rrms) of the silicon layer was 1.5 nm.

When, using this substrate, a n-type MOSFET was produced as in Embodiment 1, and measured for transistor characteristics, the threshold voltage was 0.7 V, variation of drain current due to kink was not noted, and the drain breakdown voltage was 7.3 V. Further, when flicker noise and interface level density were measured as in Embodiment 1, the results were Svg $1.8 \times 10^{-12}$ $V^2$/Hz and Nss $1.5 \times 10^{11}$/$cm^2$, respectively.

Still further, when a photodiode was produced as in Embodiment 1, and measured for dark current and photocurrent in the same condition, the results were $3.9 \times 10^{-12}$ A and $3.8 \times 10^{-10}$ A, respectively.

COMPARATIVE EXAMPLE 3

A SOI substrate was produced using the same procedure as in Comparative Example 1 except that, as the substrate, instead of the R-plane sapphire, a substrate in which $\gamma$-$Al_2O_3$ was stacked at a substrate temperature of 880° C. using the UHV-CVD method with trimethylaluminum and oxygen as raw materials on a silicon (100) substrate was used.

When the resulting substrate was measured for crystal defect density and rocking curve half width in the same method as Embodiment 1, the crystal defect density was $4.8 \times 10^8$/$cm^2$, the (004) plane half width 0.276 degree and the (040) plane half width 0.282 degree. The (040) half width increased as approaching the interface of silicon layer with sapphire. Further, the surface roughness (Rrms) of the silicon layer was 2.8 nm.

When, using this substrate, a n-type MOSFET was produced as in Embodiment 1, and measured for transistor characteristics, the threshold voltage was 0.7 V, variation of drain current due to kink was not noted, and the drain breakdown voltage was 7.1 V. Further, when flicker noise and interface level density were measured as in Embodiment 1, the results were Svg $6.6 \times 10^{-11}$ $V^2$/Hz and Nss $8.9 \times 10^{11}$/$cm^2$, respectively.

Still further, when a photodiode was produced as in Embodiment 1, and measured for dark current and photocurrent in the same condition, the dark current was $1.8 \times 10^{-11}$ A and the photocurrent was $1.8 \times 10^{-11}$ A.

INDUSTRIAL APPLICABILITY

According to the present invention, on a single crystalline oxide substrate such as sapphire, or a crystalline oxide layer stacked on a silicon substrate is a crystalline oxide layer such as $\alpha$-$Al_2O_3$, $\gamma$-$Al_2O_3$, $\theta$-$Al_2O_3$, MgO.$Al_2O_3$, $CeO_2$, $SrTiO_3$, $(Zr_{1-x},Y_x)O_y$, Pb(Zr, Ti)$O_3$, $LiTaO_3$, or $LiNbO_3$, or the crystalline fluoride layer such as $CaF_2$ a silicon layer can be formed which is very small in crystalline defect density and good in surface flatness. Therefore, on the semiconductor according to the present invention, semiconductor devices such as electronic devices or optical devices having high device performance or reliability can be obtained with improved flicker noise and operation speed, a reduction of leakage current, and improved gate oxide film breakdown voltage. These problems with the prior art SOS substrates, can be overcome using the inventive SOI substrates.

What is claimed is:

1. A semiconductor substrate comprising an insulating underlay and a crystalline silicon layer epitaxially grown thereon, said insulating underlay comprising a single crystal oxide substrate or a substrate comprising a silicon substrate and a crystalline oxide layer or fluoride layer stacked thereon, wherein a defect density evaluated by a defect density measuring method of measuring number of pits per unit area formed by immersing in an iodine type etching solution is $7 \times 10^6$/$cm^2$ or less over the entire depth direction, and surface roughness of said crystalline silicon layer is 0.05 nm to 2 nm.

2. The semiconductor substrate as claimed in claim 1, wherein said crystalline silicon layer has a X-ray diffraction rocking curve full width at half maximum of a silicon (004) peak parallel to substrate surface is 0.24 degree to 0.03 degree, and X-ray diffraction rocking curve full width of a silicon (040) peak perpendicular to substrate surface is 0.18 degree or less and 0.03 degree.

3. The semiconductor substrate as claimed in claim 1, wherein said crystalline silicon layer has a X-ray diffraction rocking curve full width at half maximum of a silicon (040) peak perpendicular to substrate surface is smaller than X-ray diffraction rocking curve full width at half maximum of a silicon (004) peak parallel to substrate surface.

4. The semiconductor substrate as claimed in claim 1, wherein said crystalline silicon layer has a X-ray diffraction rocking curve full width at half maximum of a silicon (040) peak perpendicular to substrate surface is almost constant over the entire depth direction and 0.18 degree to 0.03 degree.

5. The semiconductor substrate as claimed in claim 1, wherein, after part of said crystalline silicon layer is thermally oxidized to form a silicon oxide layer on said crystalline silicon layer, an interface level density-measured:by a charge pumping method is $3 \times 10^{11}$/$cm^2$ to $1 \times 10^9$/$cm^2$.

6. The semiconductor substrate as claimed in claim 1, wherein thickness of said crystalline silicon layer is 0.03 $\mu$m to 0.7 $\mu$m.

7. The semiconductor substrate as claimed in claim 1, wherein said insulating underlay is said single crystal oxide substrate, and said single crystal oxide substrate is a sapphire substrate.

8. The semiconductor substrate as claimed in above claim 1, wherein said insulating underlay is a laminated substrate, and wherein said crystalline oxide layer stacked on silicon substrate comprises one of $\alpha$-$Al_2O_3$, $\gamma$-$Al_2O_3$, $\theta$-$Al_2O_3$, MgO.$Al_2O_3$, $CeO_2$, $SrTiO_3$, $(Zr_{1-x},Y_x)O_y$, Pb(Zr, Ti)$O_3$, $LiTaO_3$, and $LiNbO_3$, and said fluoride layer comprises $CaF_2$.

9. A method of producing a semiconductor substrate with a low defect density silicon layer formed on an insulating underlay, said method comprising:

(a) a step of forming a first silicon layer on said insulating underlay;

(b) a step of performing a first ion implantation to said first silicon layer to make deep part of interface amorphous, and recrystallizing said amorphous layer by a first heat treatment;

(c) a step of epitaxially growing a silicon layer on said first silicon layer to form a second silicon layer; and (d) a step of performing a second ion implantation to said second silicon layer to make deep part of an interface amorphous, and recrystallizing said amorphous layer by a second heat treatment.

10. A method of producing a semiconductor substrate with a low defect density silicon layer formed on an insulating underlay, said method comprising:

(a) a step of forming a first silicon layer on said insulating underlay;

(b) a step of performing a first ion implantation to said first silicon layer to make deep part of interface amorphous, and recrystallizing said amorphous layer by a first heat treatment;

(c) a step of heat treating said recrystallized first silicon layer in an oxidizing atmosphere to oxidize part of surface side;

(d) a step of removing silicon oxide film formed in said step (c) by etching;

(e) a step of epitaxially growing a silicon layer on remaining first silicon layer to form a second silicon layer; and (f) a step of performing a second ion implantation to said second silicon layer to make deep part of interface amorphous, and recrystallizing said amorphous layer by a second heat treatment.

11. The method of producing a semiconductor substrate as claimed in claim 10, wherein when said remaining first silicon layer is formed to a predetermined thickness, said steps (c) to (d) are repeated two times or more.

12. The method of producing a semiconductor substrate as claimed in claim 10 or 11, wherein the silicon layer formed in said step (f) is regarded as said recrystallized first silicon layer formed in said step (b), and said steps (c) to (f) are repeated two times or more.

13. The method of producing a semiconductor substrate with a low defect density silicon layer formed on an insulating underlay, said method comprising:

(a) a step of forming a first silicon layer on said insulating underlay;

(b) a step of heat treating said first silicon layer in an oxidizing atmosphere to oxidize part of surface side;

(c) a step of removing silicon oxide film formed in said step (b) by etching;

(d) a step of epitaxially growing a silicon layer on remaining first silicon layer to form a second silicon layer; and (e) a step of ion implanting to said second silicon layer to make a deep part of interface amorphous, and recrystallizing said amorphous layer by heat treatment.

14. The method of producing a semiconductor substrate as claimed in claim 13, wherein when said remaining first silicon layer is formed to a predetermined thickness, said steps (b) to (c) are repeated two times or more.

15. The method of producing a semiconductor substrate as claimed in claim 13, wherein said silicon layer formed in said step (e) is regarded as said first silicon layer formed in said step (a), and said steps (b) to (e) are repeated two times or more.

16. The production method of semiconductor substrate as claimed in claim 10, wherein said oxidizing atmosphere contains a mixed gas of oxygen and hydrogen or water vapor.

17. The production method of semiconductor substrate as claimed in claim 10, wherein temperature of heat treatment in said oxidizing atmosphere is 600° C. to 1300° C.

18. The production method of semiconductor substrate as claimed in claim 10, wherein heat treatment in said oxidizing atmosphere comprises two-stage heat treatment of different temperatures of a high temperature heat treatment performed at a high temperature and a low temperature heat treatment performed at a lower temperature: subsequent to said high temperature heat treatment.

19. The method of producing a semiconductor substrate as claimed in claim 18, wherein the temperature of the high temperature heat treatment in said oxidizing atmosphere is 800° C. to 1200° C. and the temperature of the low temperature heat treatment in said oxidizing atmosphere is 700° C. to 1100° C.

20. The production method of semiconductor substrate as claimed in claim 9, wherein temperature at which a silicon layer is epitaxially grown on said first silicon layer to form a second silicon layer is 550° C. to 1550° C.

21. The production method of semiconductor substrate as claimed in claim 9, wherein before said step of epitaxially growing a silicon layer on said first silicon layer to form a second silicon layer, said first silicon layer is heat treated in a hydrogen atmosphere or in vacuum.

22. The production method of semiconductor substrate as claimed in claim 9, wherein a base pressure of growing chamber of apparatus used when a silicon layer is epitaxially grown on said first silicon layer to form a second silicon layer is $10^{-7}$ Torr or less.

23. The production method of semiconductor substrate as claimed in claim 9, wherein method of epitaxially growing a silicon layer on said first silicon layer to form a second silicon layer is a UHV-CVD method or a MBE method.

24. The production method of semiconductor substrate as claimed in claim 9, wherein when epitaxially growing a silicon layer on said first silicon layer to form a second silicon layer, growing temperature is set high only in an initial stage of growth.

25. The method of producing a semiconductor substrate as claimed in claim 24, wherein method of epitaxially growing a silicon layer on said first silicon layer to form a second silicon layer is an APCVD method or a LPCVD method.

26. The production method of semiconductor substrate as claimed in claim 9, wherein after said step of ion implanting to said second silicon layer to make deep part of interface amorphous, and recrystallizing said amorphous layer by heat treatment, or after said step of epitaxially growing a silicon layer to form a second silicon layer, further comprising a step of heat treatment in hydrogen.

27. The method of producing a semiconductor substrate as claimed in claim 26, wherein temperature of said heat treatment in hydrogen is 800° C. to 1200° C.

28. The production method of semiconductor substrate as claimed in claim 9, wherein after said step of ion implanting to said second silicon layer to make deep part of interface amorphous, and recrystallizing said amorphous layer by heat treatment, surface of silicon layer is flattened.

29. The method of producing a semiconductor substrate as claimed in claim 28, wherein said method of flattening surface of said silicon layer is a chemical and/or mechanical polishing.

30. The production method of semiconductor substrate as claimed in claim 9, wherein said step of forming a first silicon layer on said insulating underlay is a step of epitaxially growing said first silicon layer on said insulating underlay.

31. The production method of semiconductor substrate as claimed in claim 9, wherein said insulating underlay is a single crystal oxide substrate.

32. The method of producing a semiconductor substrate as claimed in claim 31, wherein said insulating underlay is a sapphire substrate.

33. The production method of semiconductor substrate as claimed in claim 9, wherein said insulating underlay is a laminated substrate comprising crystalline oxide layer or fluoride layer stacked on a silicon substrate as a substrate.

34. The method of producing a semiconductor substrate as claimed in claim 33, wherein said crystalline oxide layer comprises one of $\alpha\text{-}Al_2O_3$, $\gamma\text{-}Al_2O_3$, $\theta\text{-}Al_2O_3$, $MgO.Al_2O_3$, $CeO_2$, $SrTiO_3$, $(Zr_{1-x}Y_x)O_y$, $Pb(Zr, Ti)O_3$, $LiTaO_3$, and $LiNbO_3$, and said crystalline fluoride layer comprises $CaF_2$.

35. The semiconductor substrate characterized in that it is produced by the production method as claimed in claim 9.

36. The A semiconductor substrate characterized by comprising an insulating underlay and a crystalline silicon layer epitaxially grown thereon, said insulating underlay comprising a single crystal oxide substrate or a substrate comprising a silicon substrate and a crystalline oxide layer or fluoride layer stacked thereon, wherein a defect density evaluated by a defect density measuring method of measuring number of pits per unit area formed by immersing in an iodine type etching solution is $7 \times 10^6/cm^2$ or less over the entire depth direction, and surface roughness of said crystalline silicon layer is 0.05 nm to 0.2 nm;

wherein said semiconductor substrate is characterized in that it is produced by the production method as claimed in claim 9.

37. A semiconductor device comprising the semiconductor substrate as claimed in claim 1, for improved device characteristics.

38. The semiconductor device as claimed in claim 37, wherein said semiconductor device is MOSFET, and said improved device characteristic is at least one of mutual conductance, cut-off frequency, flicker noise, electrostatic discharge, drain withstand voltage, dielectric breakdown charge amount, and leakage current characteristics.

39. The semiconductor device as claimed in claim 38, wherein said semiconductor substrate has a thickness of crystalline silicon layer of 0.03 $\mu$m to 0.7 $\mu$m, no kink appears in current-voltage characteristic, drain withstand voltage for the case of a gate length of 0.8 $\mu$m is 7V or more, and has a characteristic that input gate voltage spectral density representing flicker noise is $3 \times 10^{-12}$ V$^2$/Hz or less at a measuring frequency of 100 Hz.

40. The semiconductor device as claimed in claim 37, wherein said semiconductor device is a bipolar transistor, and device characteristic improved is at least one of mutual conductance, cut-off frequency, collector current, leakage current, and current gain.

41. The semiconductor device as claimed in claim 37, wherein said semiconductor device is a diode, and device characteristic improved is at least one of reverse bias leakage current, forward bias current, and diode factor.

42. The semiconductor device as claimed in claim 41, wherein said diode is a pin photodiode formed on the semiconductor substrate wherein the semiconductor substrate has a thickness of crystalline silicon layer of 0.03 $\mu$m to 0.7 $\mu$m, having a pin area width of each 1 $\mu$m, and having characteristics that dark current measured under a condition applied with a 2V reverse bias is $10^{-11}$ A or less, and photocurrent under light irradiation of 1W/cm$^2$ intensity at wavelength 850 nm is $10^{-10}$ A or more.

43. The semiconductor device as claimed in claim 37, wherein said semiconductor device is a semiconductor device integrated circuit, and device characteristic improved is at least one of frequency characteristic, noise characteristic, amplification characteristic, and power consumption characteristic.

44. A semiconductor device using a semiconductor substrate as a substrate characterized in that as said semiconductor substrate, the semiconductor substrate produced by the production method as claimed in claim 9 is used, whereby improving device characteristics.

45. The semiconductor device as claimed in claim 44, wherein said semiconductor device is a MOSFET, and said device characteristic is at least one of trans-conductance, cut-off frequency, flicker noise, electrostatic discharge, drain breakdown voltage, dielectric breakdown charge amount, and leakage current characteristics.

46. The semiconductor device as claimed in claim 45, wherein said MOSFET is formed on the semiconductor substrate with a thickness of crystalline silicon layer of 0.03 $\mu$m to 0.7 $\mu$m, and no kink appears in a current—voltage measurement, a drain breakdown voltage as a measured using a gate length of 0.8 $\mu$m is 7V or more, and an input gate voltage spectral density representing flicker noise is $3 \times 10^{-12}$ V$^2$/Hz or less at a measuring frequency of 100 Hz.

47. The semiconductor device as claimed in claim 44, wherein said semiconductor device is a bipolar transistor, and said device characteristic is at least one of trans-conductance, cut-off frequency, collector current, leakage current, and current gain.

48. The semiconductor device as claimed in claim 44, wherein said semiconductor device is a diode, and said device characteristic is at least one of reverse bias leakage current, forward bias current, and diode factor.

49. The semiconductor device as claimed in claim 48, wherein said diode is a pin photodiode formed on the semiconductor substrate and the semiconductor substrate has a thickness of crystalline silicon layer of 0.03 $\mu$m 0.7 $\mu$m, having a pin area width of each 1 $\mu$m, and having characteristics that dark current measured under a condition applied with a 2V reverse bias is $10^{-11}$ A or less, and photocurrent under light irradiation of 1W/cm$^2$ intensity at wavelength 850 nm is $10^{-10}$ A or more.

50. The semiconductor device as claimed in claim 44, wherein said semiconductor device is a semiconductor integrated circuit, and said device characteristic is at least one of frequency characteristic, noise characteristic, amplification characteristic, and power consumption characteristic.

51. A method of producing a semiconductor device comprising an insulating underlay and a silicon layer formed thereon, said production method comprising:

(a) a step of forming a first silicon layer on said insulating underlay;

(b) a step of performing a first ion implantation to said first silicon layer to make a deep part of an interface amorphous, and recrystallizing said amorphous layer by a first heat treatment;

(c) a step of epitaxially growing a silicon layer on said first silicon layer to form a second silicon layer;

(d) a step of performing a second ion implantation to said second silicon layer to make a deep part of an interface amorphous, and recrystallizing said amorphous layer by a second heat treatment; and (e) after heat treating said silicon layer formed in said step (d) in an oxidizing atmosphere to oxidize part of surface side, a step of removing said formed silicon oxide film by etching to adjust said silicon layer to a desired thickness.

52. A method of producing a semiconductor device comprising an insulating underlay and a silicon layer formed thereon, said method comprising:

(a) a step of forming a first silicon layer on said insulating underlay;

(b) a step of performing a first ion implantation to said first silicon layer to make a deep part of an interface amorphous, and recrystallizing said amorphous layer by a first heat treatment;

(c) a step of heat treating said recrystallized first silicon layer in an oxidizing atmosphere to oxidize part of surface side;

(d) a step of removing said silicon oxide film formed in said step (c) by etching;

(e) a step of epitaxially growing a silicon layer on remaining first silicon layer to form a second silicon layer;

(f) a step of performing a second ion implantation to said second silicon layer to make a deep part of an interface amorphous, and recrystallizing said amorphous layer by a second heat treatment;

(g) after heat treating said silicon layer formed in said step (f) in an oxidizing atmosphere to oxidize part of surface side, a step of removing said formed silicon oxide film by etching to adjust said silicon layer to a desired thickness.

53. The method of producing a semiconductor device as claimed in claim 52, wherein when forming said remaining first silicon layer to a predetermined thickness, said steps (c) to (d) are repeated two times or more.

54. The method of producing a semiconductor device as claimed in any one of claims 52 to 53, wherein said silicon layer formed in said step (f) is regarded as said recrystallized first silicon layer formed in said step (b), and said steps (c) to (f) are repeated two times or more.

55. A method of producing a semiconductor device comprising an insulating underlay and a silicon layer formed thereon, said method comprising:

(a) a step of forming a first silicon layer on said insulating underlay;

(b) a step of heat treating said first silicon layer in an oxidizing atmosphere to oxidize part of surface side;

(c) a step of removing said silicon oxide film formed in said step (b) by etching;

(d) a step of epitaxially growing a silicon layer on said remaining first silicon layer to form a second silicon layer;

(e) a step of ion implanting to said second silicon layer to make a deep part of an interface amorphous, and recrystallizing said amorphous layer by heat treatment; and (f) after heat treating said silicon layer formed in said step (e) in an oxidizing atmosphere to oxidize part of surface side, a step of removing said formed silicon oxide film by etching to adjust said silicon layer to a desired thickness.

56. The method of producing a semiconductor device as claimed in claim 55, wherein when forming said remaining first silicon layer to a predetermined thickness, said steps (b) to (c) are repeated two times or more.

57. The method of producing a semiconductor device as claimed in any one of claims 55 to 56, wherein said silicon layer formed in said step (e) is regarded as said first silicon layer formed in said step (a), and said steps (b) to (e) are repeated two times or more.

58. The production method of semiconductor device as claimed in claim 51, wherein after said step of ion implanting to said second silicon layer to make deep part of interface amorphous and recrystallizing said amorphous layer by heat treatment, or after said step of epitaxially growing said silicon layer to form a second silicon layer, further comprising a step of heat treatment in hydrogen.

59. The production method of semiconductor device as claimed in claim 51, wherein after said step of ion implanting to said second silicon layer to make deep part of interface amorphous and recrystallizing said amorphous layer by heat treatment, surface of said silicon layer is flattened by chemical and/or mechanical polishing.

* * * * *